(12) United States Patent  
Baumgartner et al.

(10) Patent No.: US 7,906,802 B2
(45) Date of Patent: Mar. 15, 2011

(54) SEMICONDUCTOR ELEMENT AND A METHOD FOR PRODUCING THE SAME

(75) Inventors: Peter Baumgartner, Munich (DE); Domagoj Siprak, Munich (DE)

(73) Assignee: Infineon Technologies AG, Neubiberg (DE)

( * ) Notice: Subject to any disclaimer, the term of this patent is extended or adjusted under 35 U.S.C. 154(b) by 84 days.

(21) Appl. No.: 12/361,418

(22) Filed: Jan. 28, 2009

(65) Prior Publication Data

US 2010/0187575 A1 Jul. 29, 2010

(51) Int. Cl.
*H01L 27/085* (2006.01)

(52) U.S. Cl. ............ 257/255; 257/E21.014; 257/E21.561

(58) Field of Classification Search .................. 257/255, 257/213, 308, E21.014, 727, 347, E21.561; 438/197, 142, 372
See application file for complete search history.

(56) References Cited

U.S. PATENT DOCUMENTS

| | | | |
|---|---|---|---|
| 2005/0269629 A1* | 12/2005 | Lee et al. | ........................ 257/327 |
| 2007/0045736 A1 | 3/2007 | Yagishita | |
| 2008/0054361 A1 | 3/2008 | Siprak | |
| 2008/0121948 A1 | 5/2008 | Kim et al. | |
| 2008/0122015 A1 | 5/2008 | Baumgartner | |
| 2008/0169495 A1* | 7/2008 | Orner et al. | ................... 257/312 |

FOREIGN PATENT DOCUMENTS

DE  10 2007 056 741 A1   6/2008

OTHER PUBLICATIONS

Sze S. M., "Semiconductor devices, physics and technology", 2002, pp. 186-188.*
Baumgartner, P., et. al., "Semiconductore Device Having Different Fin Widths," Jun. 17, 2008, US Provisional Patent Application.

* cited by examiner

*Primary Examiner* — Thomas L Dickey
*Assistant Examiner* — Nikolay Yushin
(74) *Attorney, Agent, or Firm* — Slater & Matsil, L.L.P.

(57) ABSTRACT

Some embodiments comprise a plurality of fins, wherein at least a first fin of the plurality of fins comprises a different fin width compared to a fin width of another fin of the plurality of fins. At least a second fin of the plurality of fins comprises a different crystal surface orientation compared to another fin of the plurality of fins.

27 Claims, 18 Drawing Sheets

(A)

(B)

(A)

(B)

(B)

(A)

SEMICONDUCTOR ELEMENT AND A METHOD FOR PRODUCING THE SAME

TECHNICAL FIELD

Embodiments of the invention concern the field of semiconductor elements.

BACKGROUND

Analog and radio frequency (RF) application may result, compared to digital applications, in different requirements for semiconductor devices. While the optimization of on and off currents for digital applications can be a main target during process development, an improvement of analog transistor characteristics without process changes may be very valuable for mixed signal and RF circuits.

Improvements may be desirable in general for semiconductor device characteristics, e.g., the linearity of a current/voltage device characteristic, the voltage gain gm/gds, the signal/noise ratio or an improved harmonic distortion. Such improvements of device parameters may be also desirable for transistor devices, for example, for multiple gate field-effect transistors (MUG-FET), for fin field-effect-transistors (FIN-FET) or for other semiconductor devices.

SUMMARY OF THE INVENTION

Some embodiments relate to a semiconductor element with a plurality fins comprising a different orientation and fin width compared to another fin of the semiconductor element. Some embodiments relate to a FIN-FET, an integrated circuit and a method of producing a semiconductor element.

BRIEF DESCRIPTION OF THE DRAWINGS

FIG. 1b shows a schematic top view of the semiconductor element depicted in FIG. 1a;

DETAILED DESCRIPTION OF ILLUSTRATIVE EMBODIMENTS

With reference to the FIGS. 1a-6, embodiments are shown, which relate to a semiconductor element with a plurality of fins, to a FIN-FET, an integrated circuit (IC) and a method for producing a semiconductor element.

Figure 1A:
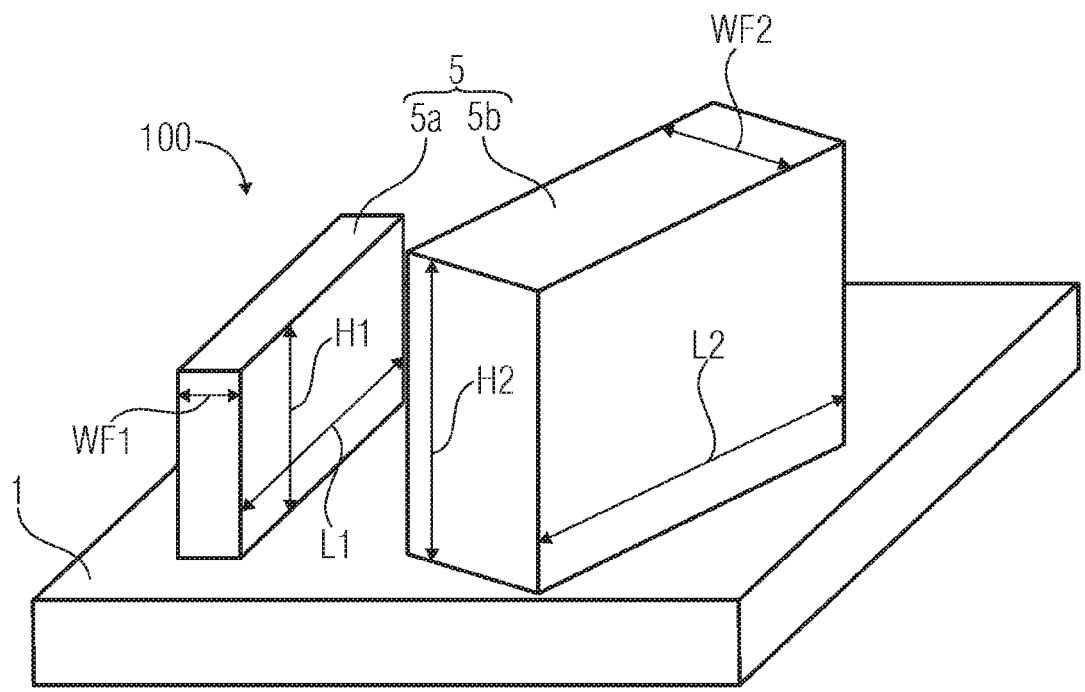
FIG. 1a shows a schematic view of a semiconductor element with a plurality of fins arranged on a substrate according to an embodiment.

According to an embodiment, in FIG. 1a, a semiconductor element is schematically depicted. The semiconductor element 100 comprises a plurality of fins 5. At least one fin 5a of the plurality of fins 5 comprises a different fin width WF1 compared to a fin width WF2 of another fin of the plurality of fins. The semiconductor element 100 comprises furthermore at least a second fin 5b of the plurality of fins 5, which comprises a different fin orientation or a different crystal surface orientation compared to another fin of the plurality of fins 5. In some embodiments the plurality of fins are arranged on at least one substrate. In some other embodiments the plurality of fins are arranged, for example, on two or more different substrates. A first fin of the plurality of fins, which includes a different fin width compared to a fin width of another fin of the plurality of fins can be arranged on a first substrate and a second fin of the plurality of fins, which includes a different crystal surface orientation compared to another fin of the plurality of fins can be arranged on a second substrate. According to some embodiments the plurality of fins can be fabricated in a so-called system-in-package (SiP) or system-on-chip (SoC) technology.

According to embodiments the second fin comprises a different fin width compared to a fin width of another fin of the plurality of fins and a different crystal surface orientation compared to another fin of the plurality of fins. This means the second fin has a different fin width and a different crystal surface orientation compared to other fins of the plurality of fins.

A fin may comprise a three-dimensional structure. A first fin 5a may, for example, comprise a fin width WF1, a fin length L1 and a fin height H1. A second fin 5b of the plurality of fins 5 may comprise a fin height H2, a fin length L2 and a fin width WF2, which may be different, partly equal or equal to the dimensions of the first fin 5a. A fin may comprise a different fin width along the length of the fin. The fin width along the length may vary, for example, continuously or step like. In some embodiments, a fin may comprise a fin width that is gradually changing along the length of the fin.

The substrate 1 may be, for example, a semiconductor substrate, e.g., a silicon substrate or a semiconductor-on-insulator (SOI) silicon substrate or a bulk silicon substrate. According to some embodiments the substrate 1 may comprise a different semiconductor material than silicon or also an insulating material. The substrate may be used in the semiconductor technology to produce a semiconductor element or a semiconductor device. A fin may comprise the same material as the substrate. It is also possible that the material of the plurality of fins is different than the material of the substrate. The plurality of fins may be conductive and the substrate may be insulating. At least parts of the plurality of fins may comprise an n-type and/or a p-type doping. According to other embodiments the substrate may also comprise at least partly a doping and hence a semiconductor characteristic.

A semiconductor device with fins comprising different fin widths may allow for improved linearity, improved transconductance (gm), i.e., a smaller drain-source resistance, output conductance (gds), voltage gain—trans-conductance divided by output conductance—(gm/gds), a reduced flicker noise and so for an improved signal/noise ratio. For a field-effect transistor (FET) the linearity of the drain current in dependence on the applied gate voltage may be improved.

A change of the fin orientation may result, because of the changed surface orientation in a changed charge carrier mobility and a reduced flicker noise. The combination of a different fin width and a fin with a changed crystal surface orientation may cause an improved linearity of the semiconductor device and a better signal-to-noise ratio. In general, the flicker noise is dependent on the different surface features of a fin such as surface roughness and surface orientation.

Figure 1B:
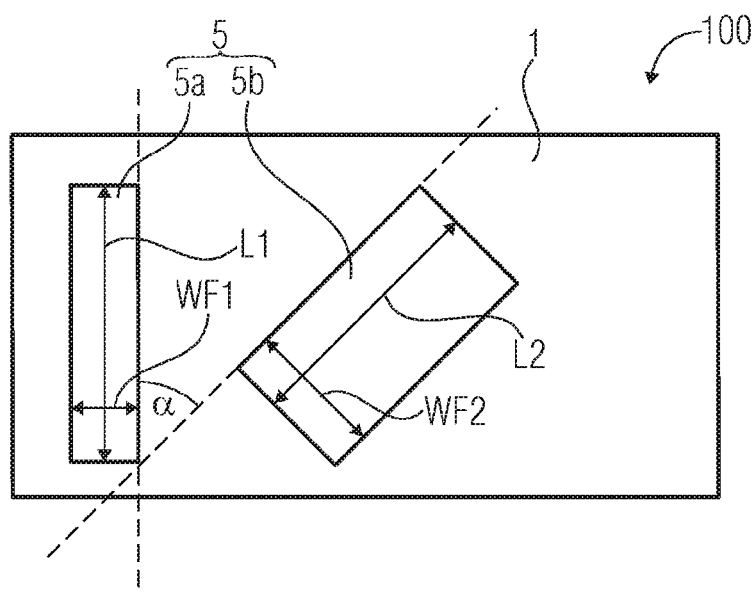

FIG. 1b shows the schematic top view of the semiconductor element 100 in FIG. 1a. The second fin 5b of the plurality of fins 5 may comprise a different crystal surface orientation compared to another fin, in this example, compared to the first fin 5a, of the plurality of fins 5. The first fin 5a and the second fin 5b may comprise a different fin orientation that can be described by an angle α. This means the orientation of the first fin 5a and the second fin 5b may differ by an angle α. According to some embodiments of the invention, this angle may be, for example, 45°±5°, 135°±5°, 225°±5° or 315°±5°.

Figure 1C:
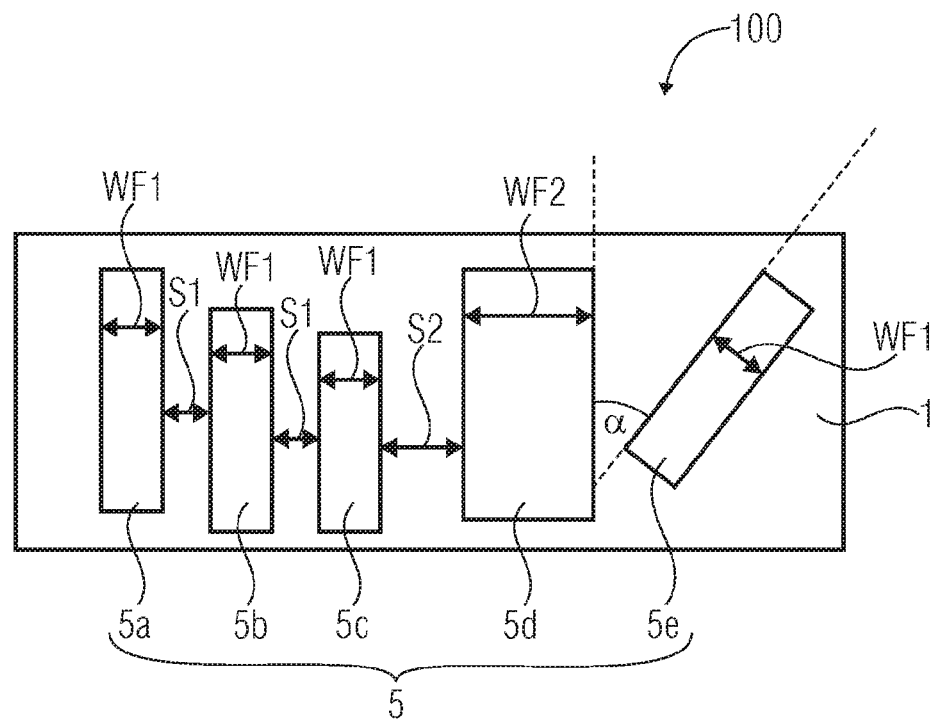
FIG. 1c shows a schematic top view of a semiconductor element comprising a plurality of parallel shifted fins according to another embodiment.

According to another embodiment, shown in FIG. 1c, a semiconductor element 100 may comprise a semiconductor substrate 1 and a plurality of fins 5 that are arranged on the semiconductor substrate. In this embodiment at least a first fin 5d of the plurality of fins 5 comprises a fin width WF2 that is different than a fin width WF1 of other fins 5a, 5b, 5c, 5e. At least a second fin 5e comprises in this embodiment a different crystal surface orientation compared to other fins 5a, 5b, 5c, 5d of the plurality of fins 5. The different orientation can be described by an angle α. In this embodiment several fins 5a-5d may be arranged in parallel wherein the fins may comprise a different length and may be, for example, shifted parallel to each other. The distance between two fins may be, for example, S1 or different, for example, S2. According to embodiments at least some fins of the plurality of fins may be arranged periodically with a certain distance or pitch. At least some fins may be arranged in parallel and the distance or pitch between two adjacent fins may be equal or different.

Figure 1D:
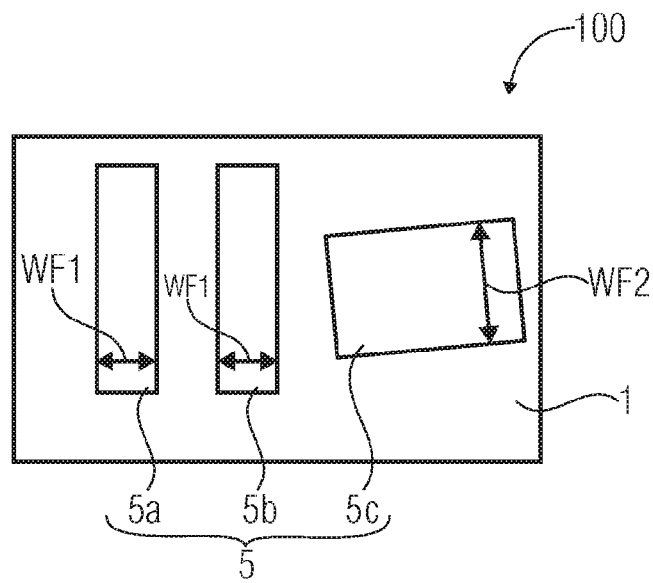
FIG. 1d shows a schematic top view of a semiconductor element according to another embodiment.
Figure 1E:
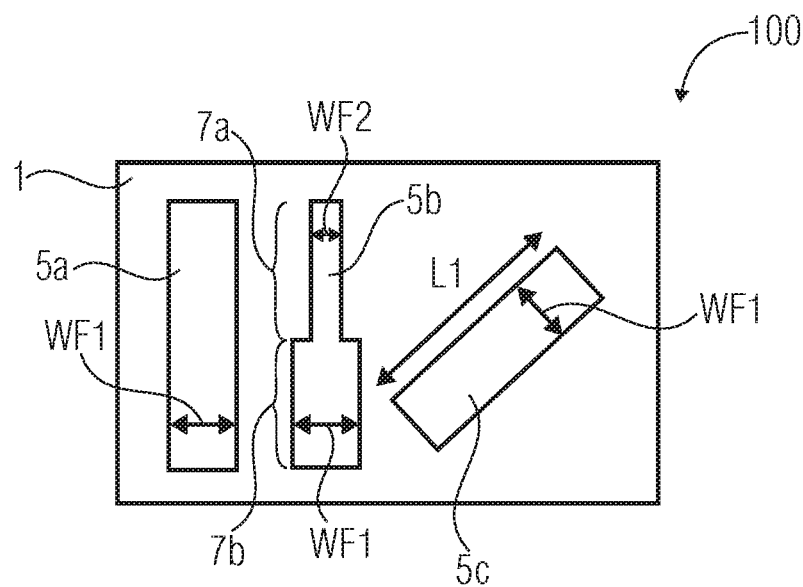
FIG. 1e shows a schematic top view of a semiconductor element with a first fin comprising a step-like fin width along the fin length according to another embodiment.

In FIG. 1d, according to an embodiment, a schematic top view of a semiconductor element 100 is shown. In this embodiment the second fin 5c comprises a different crystal surface orientation compared to the fins 5a and 5b. Furthermore, the second fin comprises in this embodiment a different fin width WF2 compared to the fin width WF1 of the remaining fins 5a, 5b. In this embodiment, the second fin 5c is the first fin. This means that the second fin 5c comprises a different crystal surface orientation and a different fin width compared to other fins 5a and 5b of the plurality of fins. In another embodiment of the semiconductor element 100 (FIG. 1e) a fin 5b may comprise a first segment 7a and a second segment 7b. The fin width in the first segment 7a may be WF2 and the fin width in the second segment 7b of the fin 5b may be WF1. Another fin 5a of the semiconductor element 100 may comprise along the whole length a fin width WF1. The same may be the case for the fin 5c, which may also comprise a fin width WF1 along the whole fin length L1. In this embodiment the fin 5c may comprise a different orientation compared to the fins 5a and 5b.

A semiconductor element can comprise a fin with a fin width along the first segment 7a wherein the fin width along the first segment 7a is different compared to the fin width of another fin of the plurality of fins. In this embodiment a first fin, here fin 5b, comprises at least a first segment 7a wherein the fin width along the first segment 7a is different from a fin width of at least a second segment 7b of the first fin 5b.

Figure 1F:
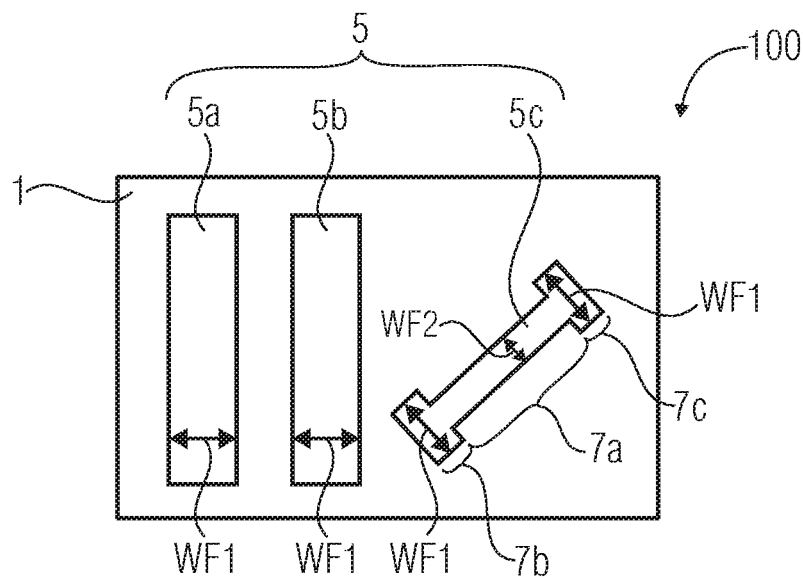
FIG. 1f shows a schematic top view of a semiconductor element with a second fin comprising different fin segments according to another embodiment.

As is shown in FIG. 1f, a semiconductor element 100 may comprise a fin 5c wherein fin 5c comprises three segments 7a, 7b and 7c, wherein the fin width of the first segment 7a is WF2 and wherein the fin width of the second segment 7b and the third segment 7c is WF1, which may be different to WF2.

According to an embodiment the semiconductor element may comprise a plurality of fins arranged on a semiconductor substrate wherein at least a part or a segment of a first fin of the plurality of fins comprises a different fin width compared to a fin width of another fin of the plurality of fins. A second fin of the plurality of fins may comprise a different angle or a different crystal surface orientation compared to another fin of the plurality of fins.

Figure 1G:
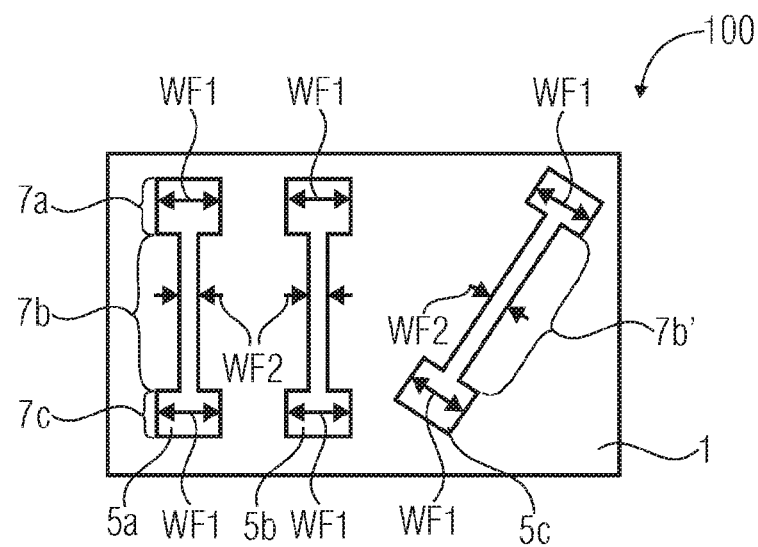
FIG. 1g shows a schematic top view of a semiconductor element according to another embodiment.

FIG. 1g shows a schematic top view of a semiconductor element according to another embodiment. The semiconductor element 100 comprises again a semiconductor substrate 1 and a plurality of fins 5a, 5b and 5c arranged on the semiconductor substrate 1. In this embodiment each of the fins comprises, for example, three segments 7a, 7b and 7c, wherein the width of a segment 7b may be different to a fin width of a segment 7a and 7c. In this embodiment a first fin 5a of the plurality of fins may comprise a different fin width, for example WF1 (segment 7c or segment 7a), compared to a fin width WF2, for example, of the segment 7b' of fin 5c. Fin 5c may comprise also a different crystal surface orientation from fins 5a and 5b.

One parameter for a semiconductor element, which can be controlled by layout, is the width of the fin. Changing the fin width of a semiconductor element that may be part of a semiconductor device or an integrated circuit may result in changed semiconductor device parameter. Such a semiconductor device parameter could be in the case of a field-effect transistor (FET) the threshold voltage (Vt) of the field-effect transistor. The change of the threshold voltage may be due to quantum confinement and electrostatic effects. The fin width of a fin can be changed in many ways. By changing the fin width along the length of the fin it may be possible to improve electrical characteristics, like series resistance, trans conductance (gm), output conductance (gds), drain capacitance or flicker noise of a FET.

According to some embodiments of the invention at least a fin of the plurality of fins may comprise a source region and a drain region separated by a channel region. That means parts of the fin may act as a channel region for a field-effect transistor and parts of the fin may act as a source region with a respective source contact or electrode, which is separated from a drain region with a drain contact or electrode, by the channel region 88. The channel region 88 may be at least partly covered with a gate dielectric and the gate dielectric may be at least partly covered with the gate electrode 15, so that a fin field-effect transistor is formed and a current flow through the channel region of the fin may be, among others, controlled by a voltage applied to the gate electrode 15.

A multi gate device or a multi gate field-effect transistor (MUG-FET) may refer to a metal oxide semiconductor field-effect transistor (MOSFET), which comprises more than one gate on a single device. A multiple gate field-effect transistor, which uses narrow silicon fins and multiple gates on top and sides of the fin, can improve the gate control compared to conventional planar devices. These multiple gates may be controlled by a single gate electrode wherein the multiple gate surfaces act electrically as a single gate or as independent gates. In a MUG-FET or FIN-FET, the channel is surrounded by several gates on multiple surfaces, allowing more effective suppression of off-state leakage current. Multiple gates also allow enhanced current in the on-state, also known as drive current. These may lead to lower power consumption and enhanced device performance. A gate surface and a fin surface of a FIN-FET or a MUG-FET may be oppositely arranged to each other.

A FIN-FET transistor may comprise a channel region or conducting channel, which has wrapped around a thin fin, which forms the body of the device. The fins of a bulk FIN-FET may be etched in a bulk silicon substrate. A fin of a bulk-FIN-FET may comprise, in addition to the source-, drain- and gate contacts, a body contact to the bulk silicon substrate. According to an embodiment in a bulk-FIN-FET a part of the fin under the channel region may be connected to the substrate. The bulk-FIN-FET may comprise at least one fin of the plurality of fins having a body-contact that is connecting an inner part of the one fin under an overlapping part of a gate dielectric and a gate electrode with a body-terminal of the device. The body-contact, which is formed in an inner part of a fin, may at least partly overlap with a stack, which is formed by the overlapping part of the gate dielectric and the gate electrode.

Figure 2A:
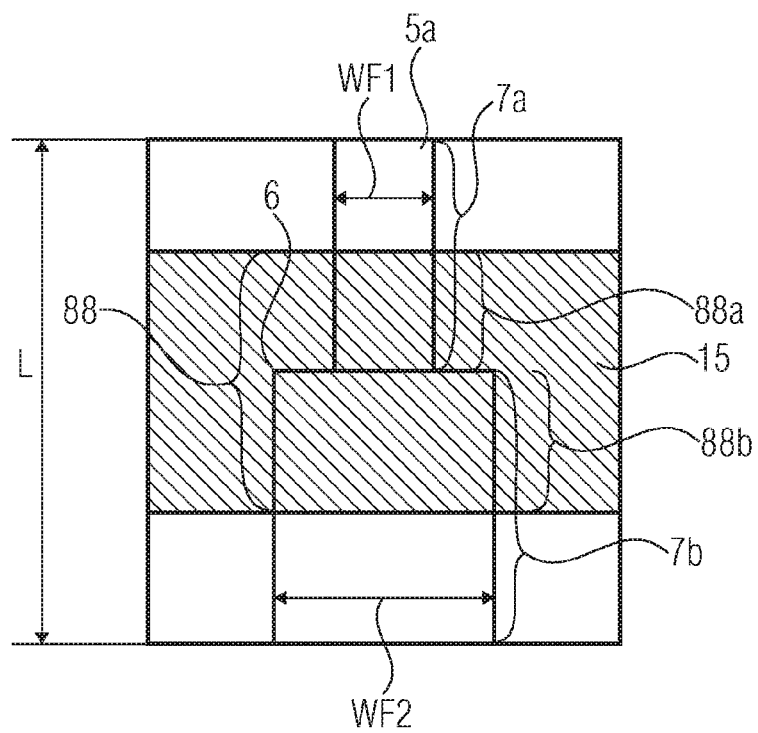
FIG. 2a shows a schematic top view of a fin with different fin widths connected in series and a gate thereon according to an embodiment.
Figure 2B:
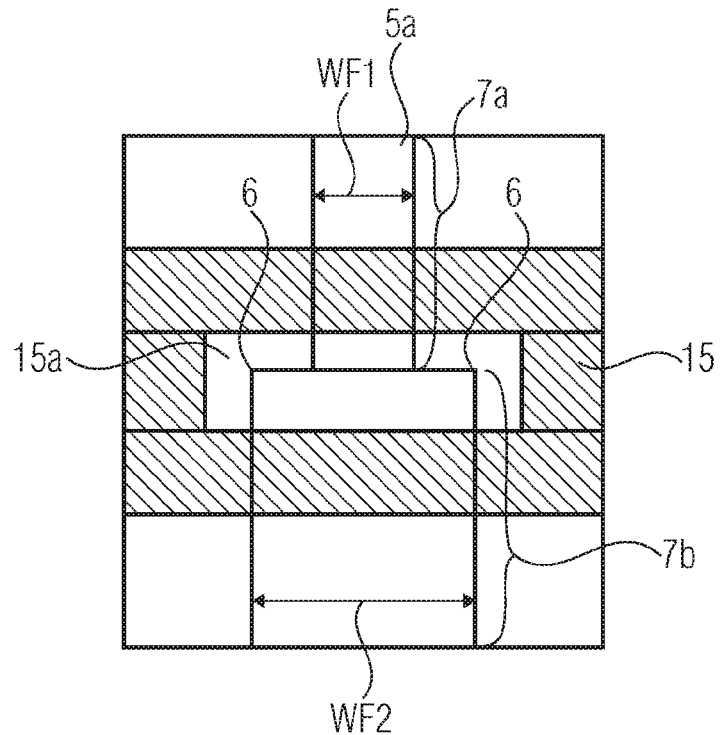
FIG. 2b shows a schematic top view of a fin with segments comprising different fin widths and a structured gate thereon according to an embodiment.
Figure 2C:
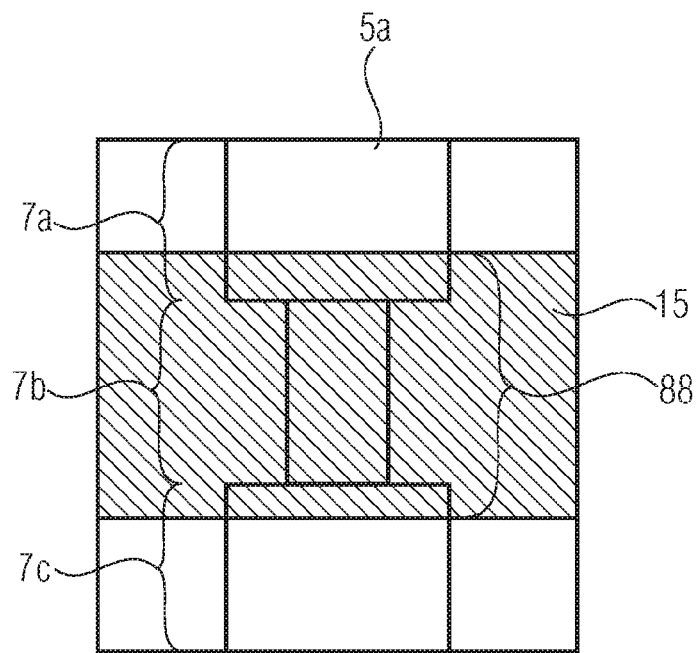
FIG. 2c shows a schematic top view of a fin with segments comprising different fin widths and a gate thereon according to another embodiment.

Some possible fin configurations are shown in FIGS. 2a-2e. In FIG. 2a, a schematic top view picture of a fin 5a is shown. The fin 5a may comprise a first segment 7a and a second segment 7b. In this embodiment the fin width of the fin 5a is step-like changed along the fin length L. That means in this embodiment the fin width WF1 of the first segment 7a is smaller than the fin width WF2 of the second segment 7b. In this embodiment at least parts of the first segment 7a and the second 7b segment of the fin 5a may be covered by a gate 15. The gate 15 may be insulated from the fin 5a by a gate dielectric (not shown in the top view of FIG. 2a) below the gate 15. A channel region 88 of a FIN-FET transistor may be formed by the overlapping part of the gate 15 and the fin 5a. The channel region 88 may comprise two channel region parts 88a and 88b. The two different fin widths WF1 and WF2 can be used to generate two channel region parts 88a, 88b with different threshold voltages, for self cascading of the FIN-FET transistor (improved gds). Using such a fin with a fin width changing step-like along the fin length may result, for example, in an improved output conductance (gds) and an improved voltage gain (gm/gds). In some embodiments the wider fin segment may form the source region and the narrow fin segment the drain region of a FIN-FET. In other embodiments the wider fin segment may form the drain region and the narrow fin segment of a FIN-FET. If the fin structure described in FIG. 2a uses the narrow fin segment 7a as source region, the output conductance (gds), and so the voltage gain, gm/gds can be improved due to a reduced drain-induced barrier lowering (DIBL) and short channel effects (SCE). This embodiment seems preferable for low-frequency applications needing a high voltage gain gm/gds. If the fin structure described in FIG. 2a uses the narrow fin segment 7a as drain region, the source resistance can be reduced and so the transconductance gm can be increased through the wider fin at the source side and the Miller capacitance can be reduced through the narrower fin part at the drain side, but possibly at the cost of a reduced gds. This embodiment seems preferable for high frequency applications where the drain to source conductance is lower compared to the low frequency case and the circuit can benefit from an increased transconductance gm. Possible reliability problems of such a structure, which may result from the fin edges 6, can be solved by additionally segmenting the gate 15. This is shown, for example, in FIG. 2b. In this embodiment a fin 5a may comprise again two segments 7a and 7b with different fin widths WF1 and WF2 and a gate 15, for example, a poly gate, with a recess of the gate forming a pocket or slot 15a, which does not act as gate electrode. The pocket or slot 15a may be arranged on the fin such that edges 6 between the first segment 7a and second segment 7b are not covered by the gate electrode 15.

According to some embodiments a fin may comprise a channel region 88 of a fin field-effect transistor (FIN-FET) wherein the fin comprises at least a first channel region segment 88a, with a fin width WF1 along the first channel region segment 88a, which is different from a fin width WF2 of at least a second channel region segment 88b of the fin, so that the first channel region segment 88a and the second channel region segment 88b are coupled in series.

According to another embodiment (FIG. 2c) a fin 5a may comprise three segments 7a, 7b and 7c, wherein the widths of the segments 7a and 7c may be different to the fin width of the segment 7b. The gate electrode 15 may be at least partly overlapping the segments 7a, 7b and 7c. In other words the gate electrode 15 can at least overlap a part of the first segment 7a, the second segment 7b and the third segment 7c. The gate electrode 15 may be a poly gate electrode, which is electrically insulated by a dielectric layer against the channel region 88. The dielectric layer may comprise, for example, silicon oxide, nitrided silicon oxide, nitride, oxinitride or a high-k dielectric like HfSiON. The dielectric layer may be arranged between the gate electrode 15 and the fin 5a. The wider sections 7a and 7c of the fin can be used to reduce a source and drain series resistance of a FIN-FET comprising the fin 5a.

Figure 2D:
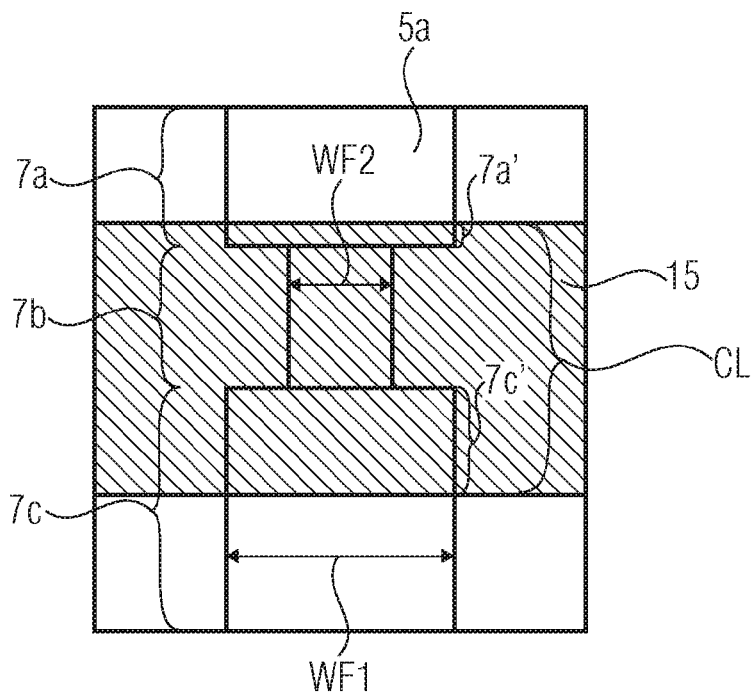
FIG. 2d shows a schematic top view of a fin with segments comprising different fin widths and a gate asymmetric overlapping parts of the segments so that two asymmetric channel regions are formed according to another embodiment.

In FIG. 2d another embodiment of a fin with a different fin width is shown. In this embodiment the fin 5a comprises three fin segments 7a, 7b and 7c wherein the fin width WF1 of the fin segments 7a and 7c is different to the fin width WF2 of the fin segment 7b. At least parts of the fin segments 7a, 7b and 7c are covered or overlapped by the gate electrode 15. Compared to the embodiment depicted in FIG. 2c a channel length CL of a channel region of a FIN-FET transistor is asymmetric. This means a part 7a' of the fin segment 7a that is covered by the gate electrode 15 may have a different dimension than a part 7c' of fin segment 7c. Accordingly, it is also possible to combine a resistance reduction, as it is described in context to FIG. 2c, with an asymmetric channel. Because flicker noise (1/f-noise) has different contributions along channel length and surface orientation modulation of fin width along channel length can tailor noise contributions along channel length, an asymmetric channel can result in a reduced total amount of flicker noise.

Figure 2E:
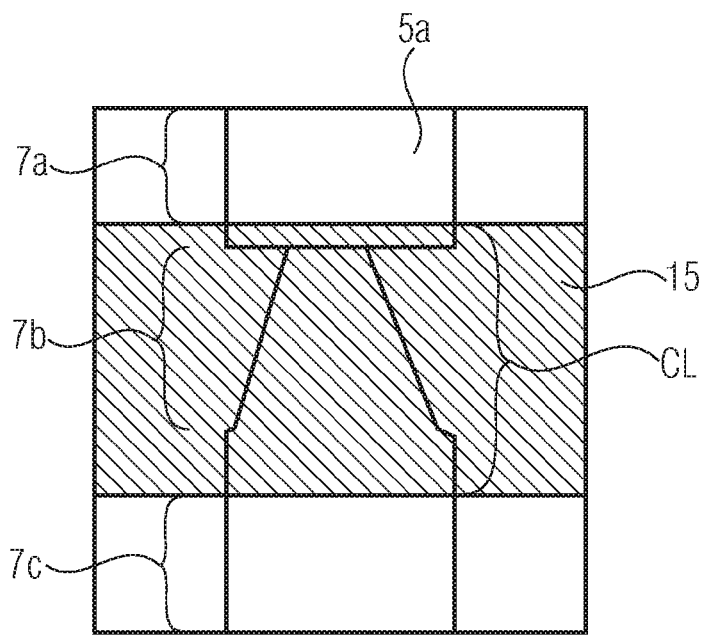
FIG. 2e shows a schematic top view of a fin with segments comprising different fin widths and a graduated channel region according to another embodiment.

According to the embodiment in FIG. 2e a fin 5a may comprise at least a segment 7b wherein the fin width along the segment varies continuously along the length of the segment 7b. In another embodiment the fin width may vary continuously along the whole length of the fin. The fin 5a in FIG. 2e may comprise again three segments 7a, 7b, 7c wherein the segments 7a, 7b and 7c are at least partly covered or overlapped by a gate electrode 15. A current flow through the channel region with the channel length CL may controllable by a voltage that is applied at the gate electrode 15. The continually graduated channel width in the segment 7b may result in a good electrical performance among others with respect to the flicker noise, the linearity and the conductance.

Figure 2F:
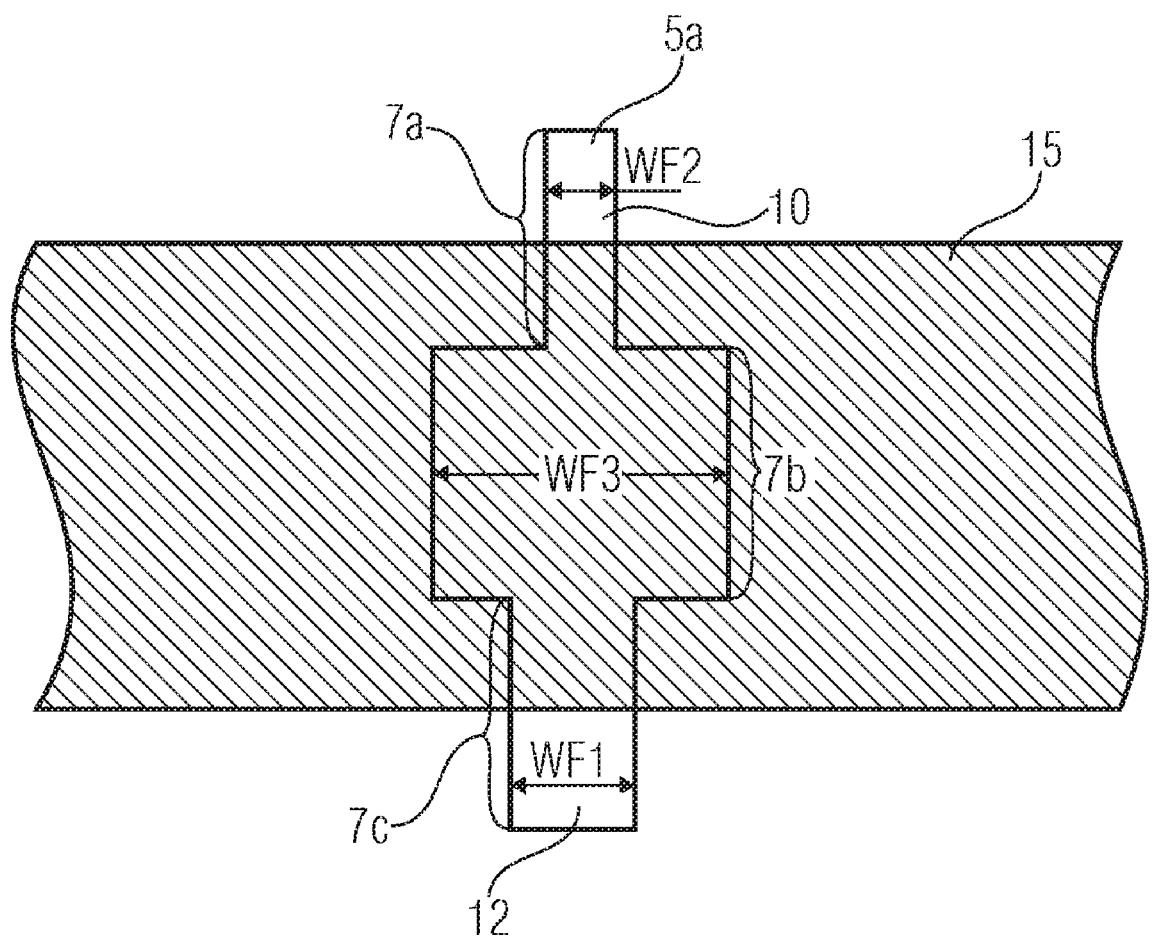
FIG. 2f shows a schematic top view of a fin having a stepped fin structure with a broad fin width in the center of the fin.

According to some embodiments a fin, for example, shown in FIG. 2f, has a stepped fin structure with a broad fin width in the center of the fin. In some embodiments the fin 5a in FIG. 2f is included as a portion of a device, for example, a FIN-FET or a varactor. The fin shown in FIG. 2f has three segments, a first segment 7a having a fin width WF2, a second segment 7b having a fin width WF3 and a third segment 7c with a fin width WF1. In some embodiments, a gate electrode 15 overlaps completely the second segment 7b of the fin and a portion of the first segment 7a and third segment 7c of the fin 5a. FIG. 2f presents the inverted structure of the embodiment in FIG. 2c. In FIG. 2f the fin may comprise narrow fin segments at a drain region (WF2) 10 and at a source region (WF1) 12 and a fin segment with larger fin width (WF3) compared to fin segments connected to drain and source in the center of this multiple fin width fin device connecting different fin width in series. In some embodiments, WF3 is larger than WF2 and WF3 is larger than WF1. In some embodiments, WF3 is larger than WF2 and WF3 is larger than WF1 and WF1 is larger than WF2. In some embodiments, WF3 is larger than WF2 and WF2 is equal to WF1. Furthermore, a fin may comprise at least at a part or at a segment of the fin 5a a graduated fin width and therewith a graduated channel region.

Figure 3:
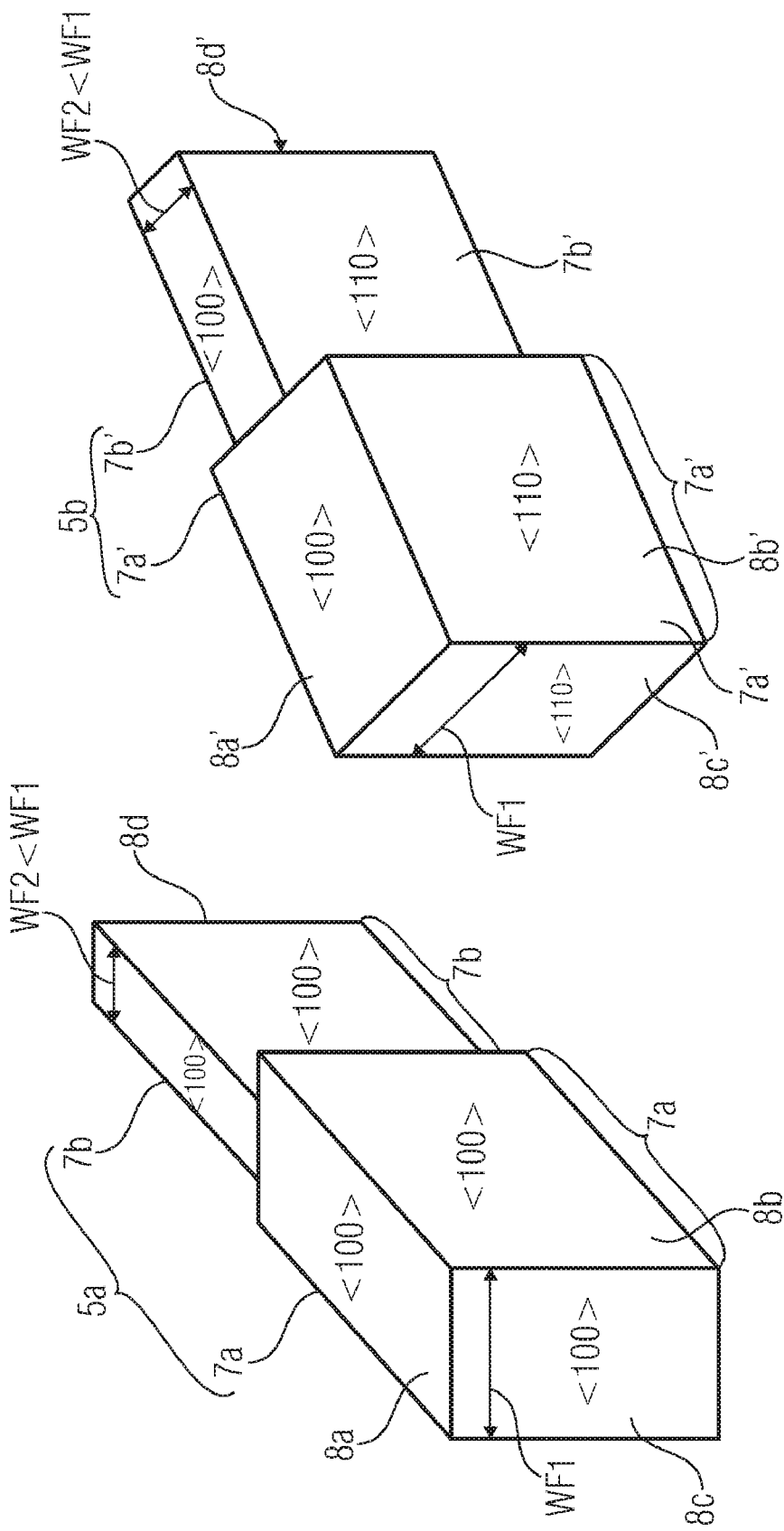
FIG. 3 shows a schematic view of a plurality of fins with a different crystal surface orientation of the side walls and a fin width changing along a fin length according to an embodiment.

FIG. 3 shows the schematic view of a plurality of fins, in this embodiment, for example, of two fins 5a and 5b. The first fin 5a comprises two fin segments 7a and 7b, wherein the fin width of the first fin segment 7a is WF1 and the fin width of the second fin segment 7b is WF2 (WF2≠WF1). Both fins 5a and 5b may be arranged on a substrate, which is not shown in FIG. 3. Fin 5a comprises a top wall 8a, a side wall 8b, a front wall 8c and a back wall 8d.

In the following the crystal surface orientation may be defined by the Miller indices, which are determined by first finding the intercepts of the plane with the three basis axes in terms of the lattice constants of a crystal, and then taking the reciprocals of these numbers and reducing them to the smallest three integers having the same ratio. The result is enclosed in parentheses (hkl) as the Miller indices for a single plane or a set of parallel planes, wherein h, k, l are integers. Another convention is given by <hkl>, which describes a full set of equivalent crystal directions. In some embodiments crystal surfaces may have surface directions <100>, <010>, <001>, <110> or <101>. To describe the direction of the current flow inside a specific surface plane the notation [xyz] is used to describe a current flow in x, y and z direction. [100] describes the current flow in x direction, [010] describes the current flow in y direction and [001] describes the current flow in z direction. For example, a current can flow in a <100> surface plane in orthogonal directions [010] or [001] or a combined non orthogonal direction [011].

In the embodiment shown in FIG. 3 the crystal surface orientation of the top wall 8a may be a <100> orientation. The side wall orientation 8b of the first 7a and second 7b segments of the fin 5a may also comprise a <100> crystal surface orientation. The front wall 8c and the back wall 8d may also comprise a crystal surface orientation <100>. The second fin 5b may comprise again a first segment 7a' and a second segment 7b' wherein the fin width WF1 of the first fin segment 7a' and the fin width WF2 of the second fin segment 7b may be different again. The fin 5b may comprise a different crystal surface orientation compared to the fin 5a. The top wall 8a' of the second fin 5b may comprise a <100> crystal surface orientation. The side walls 8b of the first segment 7a' and the second segment 7b' of the fin 5b may comprise a <110> crystal surface orientation, which is different compared to the side wall crystal surface orientation of the fin 5a. The front wall 8c' and the back wall 8d' of the second fin 5b may also comprise a <110> crystal surface orientation, which is different compared to the first fin 5a.

According to some embodiments the top and side walls of a fin show different surface orientation for at least one fin orientation. For example, two fins 5a and 5b may comprise two segments having a different fin width. The first fin 5a may have a <100> crystal surface orientation for top and side wall planes and the second fin 5b may have a <100> crystal surface orientation for top wall planes and a <110> orientation for side wall planes of the fin.

A substrate or semiconductor substrate, for example, a silicon wafer may comprise a <100> orientation. A charge carrier mobility along different crystal orientations of the wafer may be different. Furthermore, carrier mobility may also depend on the direction of current flow (=charge transport) inside a specific surface plane of the fin. So, e.g., the carrier mobility of charges flowing in a <100> surface may be different for a current flow in [010] direction or [001] direction. In contrast, flicker noise may be only dependent on the surface orientation of the fin plane that is in touch with the gate dielectric. According to some embodiments of the invention a surface crystal orientation may be, for example, <100>, <110> or <111>. According to other embodiments of the invention a second fin may have a <100> top wall crystal surface orientation and a <100> side wall crystal surface orientation. Another fin of the plurality of fins may have a <100> top wall crystal surface orientation and a <110> side wall crystal surface orientation.

Figure 4A:
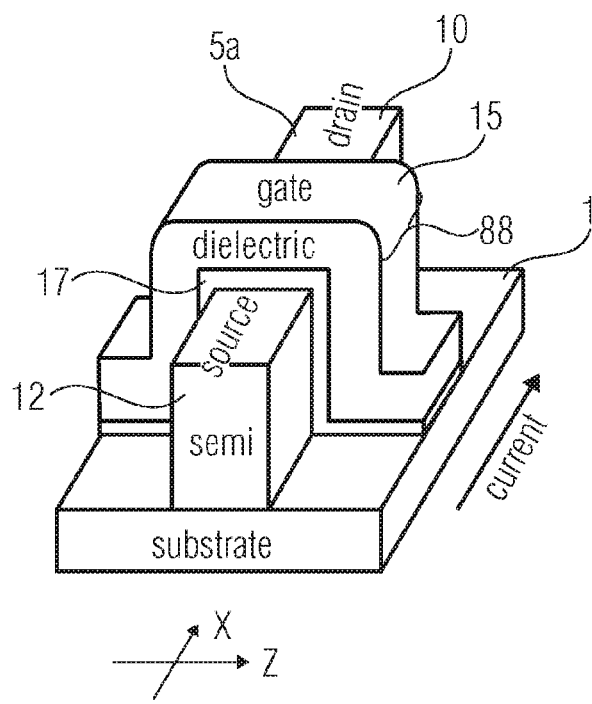
FIG. 4a shows a schematic side view of a MUG-FET or a FIN-FET.

In FIG. 4a a schematic drawing of a MUG-FET or a FIN-FET with a fin, for example, a silicon fin 5a, a gate dielectric 17 and a gate electrode 15 surrounding the fin to form gates on the sides and on the top planes of the fin 5a is shown. The fin 5a may be arranged on a substrate 1 which is arranged in an x-z plane. The fin 5a may comprise a drain region 10 and a source region 12, wherein the source and the drain region are separated by a channel region 88 which is covered by the dielectric 17 and the gate electrode 15. The source and the drain region may comprise a different conductivity than a channel region 88. This means that the source and the drain regions may be doped with a different type of dopant compared to the channel region 88. In this embodiment a significant current may flow in the fin in x-direction, if the FIN-FET is turned on, by applying a voltage higher than a threshold voltage Vt at the gate 15 and by applying a correct source-drain voltage at the source- and drain electrode. The current flow may be controlled by a voltage applied at the gate electrode surrounding the fin to form gates on the side and on the top plane of the fin 5a. According to embodiments a source region 12 and a drain region 10 of a fin 5a may comprise n-type conductivity and a channel region 88 p-type conductivity. The channel region may be covered by the gate dielectric 17 and the gate electrode 15. As it is known by applying the correct voltages at the gate, at the source and at the drain region a current can flow in the channel region between the source and drain region. Such a device may be an NMOS-FIN-FET. In other embodiments a PMOS-FIN-FET can be formed accordingly by changing the conductivities of the source, drain and channel region.

Figure 4B:
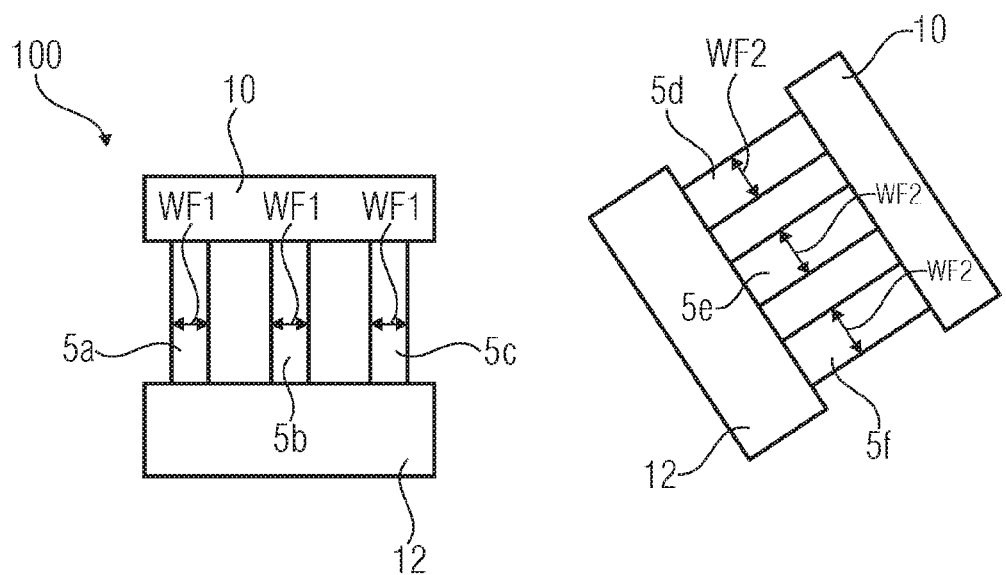
FIG. 4b shows a schematic top view of a FIN-FET structure with a plurality of fins comprising a different fin width and a different crystal surface orientation according to an embodiment.

FIG. 4b shows a schematic top view of a semiconductor element 100 or FIN-FET structure comprising a plurality of fins 5a to 5f. The fin width WF1 of the fins 5a to 5c may be different to the fin width WF2 of the fins 5d to 5f. The fins 5d to 5f may comprise a different crystal surface orientation compared to the fins 5a to 5c. The fins 5a to 5c may comprise a common drain region 10 and a common source region 12. The same may be valid for the fins 5d to 5f. The plurality of fins in a MUG-FET transistor may be in parallel connections. This means that they may comprise a common source region 12 and a common drain region 10. The gate electrode is not shown in FIG. 4b. In other embodiments the plurality of fins may be connected in series.

Figure 4C:
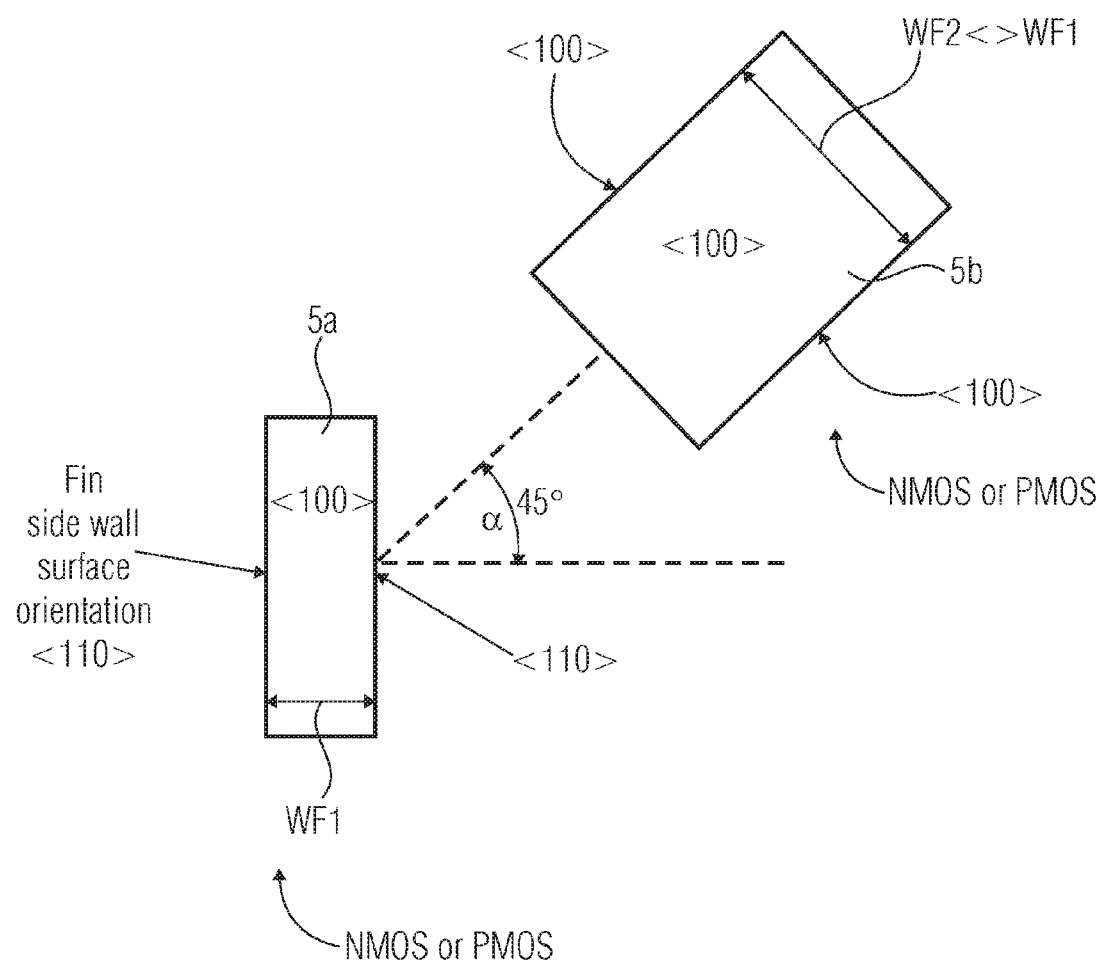
FIG. 4c shows a schematic top view of a semiconductor element with a plurality of fins wherein a second fin compared to a first fin comprises an angle of approximately 45° and a different fin width.

In FIG. 4c the schematic top view of two fins having different crystal surface orientations by arranging one fin in a 45° rotated manner compared to the other fins is shown. A first fin 5a may comprise a fin width WF1 and a second fin 5b may comprise a different fin width WF2. The top wall of both fins may be in <100> direction and both fin orientation may differ by an angle of 45°. The fin 5a and the fin 5b could be, for example, a fin of an NMOS and/or a PMOS transistor. The fin side wall surface orientation of the fin 5a may comprise a <110> orientation and the fin side wall surface orientation of the fin 5b may comprise a <100> orientation. The rotated fin 5b may have a <100> crystal surface orientation in top and side wall planes of the fin and the non-rotated fin 5a may have a <100> orientation in the top surface and a <110> crystal surface orientation in the side wall planes of the fin.

Fins with different fin widths and different fin orientations (rotated/not rotated) can be connected in series or in parallel to form devices for improved linearity, analog gain (gm/gds) and improved signal-to-noise ratio.

Figure 4D:
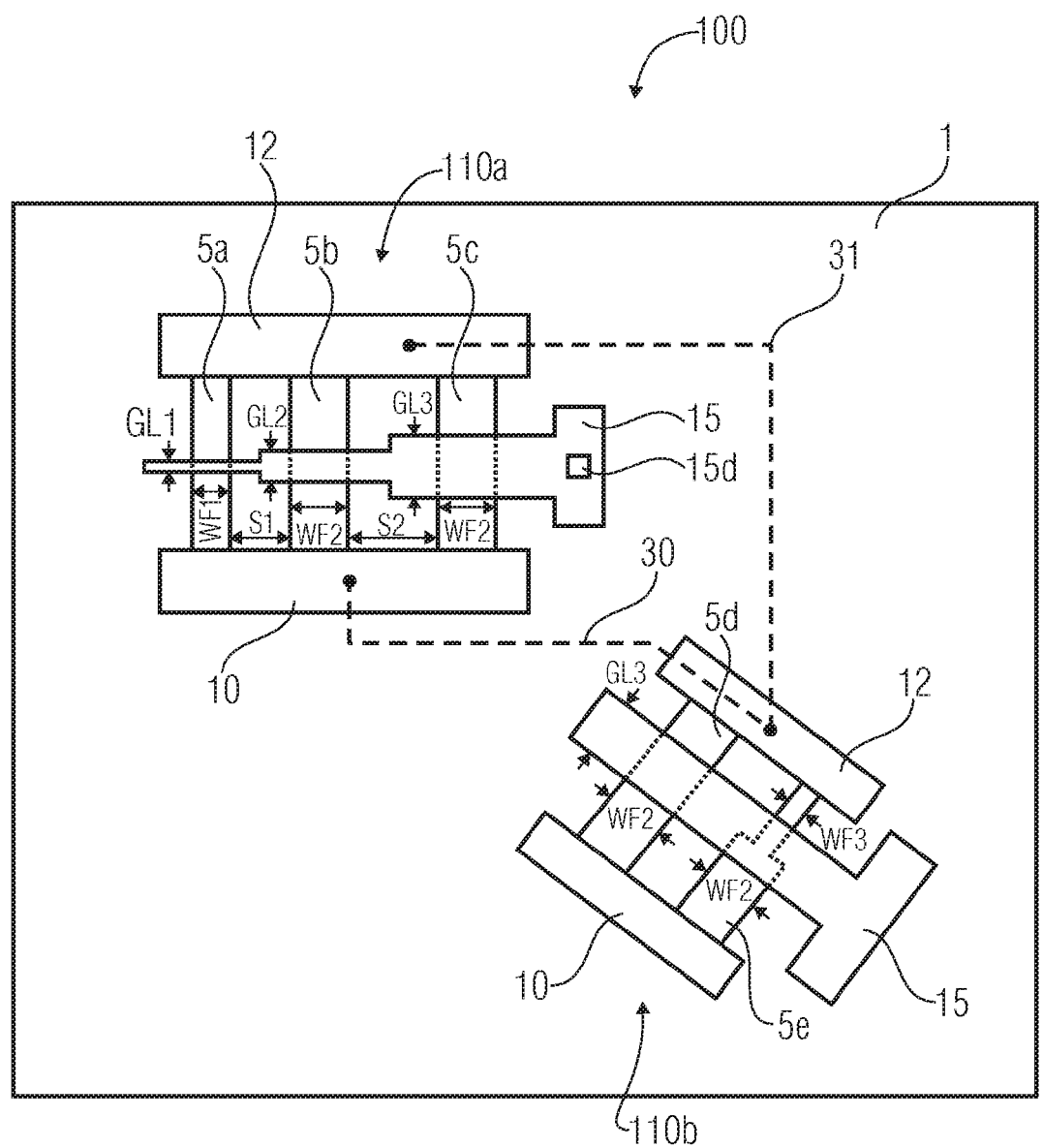
FIG. 4d shows a schematic top view of a semiconductor element with two FIN-FETs, wherein a first FIN-FET comprises fins with different fin widths, gates with different gate dimensions and different pitches between the fins, and a second FIN-FET comprises at least one fin with a different crystal surface orientation compared to the fins of the first FIN-FET.

In FIG. 4d, a schematic top view of a semiconductor element 100 comprising two FIN-FETs 110a, 110b with different fin widths, different gate dimensions and different pitches between the fins is shown. The two FIN-FETs 110a and 110b are arranged on a substrate 1. The first FIN-FET 110a comprises three fins 5a, 5b and 5c, wherein the fin width of fin 5a is WF1. WF1 is different to the fin width WF2 of fins 5b and 5c. The distance or pitch between adjacent fin 5a and fin 5b is S1, and the distance between adjacent fin 5b and fin 5c is S2. The value of S1 and S2 can be equal or different according to some embodiments. The value of a gate resistance for a fin depends on one side on the distance of the fin from a gate contact 15d due to the lateral gate sheet resistance and on the other side on the total area covered by the gate due to the vertical contact resistance that arises from different interface resistances in the gate stack comprising different materials. In some embodiments, the fin pitch increases with distance from the gate contact 15d and in other embodiments the pitch decreases with the distance from the gate contact 15d. Thus, it is possible to tune the gate resistance of a FIN-FET.

The three fins 5a, 5b and 5c comprise a common source region 12 and a common drain region 10, i.e., the fins of each FIN-FET are coupled in parallel. In this embodiment, the gate electrode 15 for the first FIN-FET 110a is structured so that the three fins comprise different gate lengths. Fin 5a comprises a gate length GL1, fin 5b a gate length GL2 and fin 5c a gate length GL3. Because of the different fin widths WF1 and WF2, the gate width, and hence, the gate dimensions of fins 5a, 5b and 5c are different. The gate dimension can be defined by the fin area covered with the gate electrode 15. It should be noted that the fin is a three-dimensional structure, and hence the gate dimension can include the area of the fin top-wall, as well as the areas of the fin side-walls, which are covered by the gate electrode. In other words the gate dimension of a fin can be the surface area of the fin covered with the gate electrode, and that can be used to control the current flow in the channel region of the fin.

In the embodiment in FIG. 4d the semiconductor element 100 comprises a second FIN-FET 110b. This FIN-FET 110b includes two fins 5d and 5e, wherein both fins 5d and 5e comprise a different crystal surface orientation compared to the fins of the first FIN-FET 110a. Fin 5e comprises a stepped-fin width structure with a first fin segment with a fin width WF2 and a second fin segment with a fin width WF3. Parts of the fins 5e and 5d are covered with a gate electrode 15. Because of the structure of fins 5d and 5e the gate dimensions of fins 5d and 5e are different as well.

According to the embodiment in FIG. 4d a semiconductor element 100 comprises a plurality of fins 5a, b, c, d, e arranged on the substrate 1, wherein at least a first fin, for example, fin 5a of the plurality of fins comprises a different fin width WF1 compared to a fin width of another fin, for example, one of fin 5b, c, d, e of the plurality of fins, and wherein at least a second fin, for example, fin 5d or fin 5e of the plurality of fins comprises a different crystal surface orientation compared to one of the other fins 5a, b, c of the plurality of fins.

In other embodiments FIN-FET 110a and FIN-FET 110b can be coupled in series, as it is depicted schematically with the dashed line 30. This means, the drain region 10 of the first FIN-FET 110a is coupled to the source region 12 of the second FIN-FET 110b or the source region 12 of the first FIN-FET 110a is coupled to the drain region 10 of the second FIN-FET 110b. According to another embodiment the FIN-FET 110a and the FIN-FET 110b can be coupled in parallel, as it is also schematically depicted with the dashed line 31, i.e., the source regions 12 of the first and second FIN-FET 110a, 110b and the respective drain regions 10 are coupled in parallel. The FIN-FET may be connected by a conductive material, for example, a metal layer or poly-silicon. The FIN-FETs may be part of a circuitry of an integrated circuit.

A FIN-FET combining different fin widths in parallel may be used as a tunable capacitance (for example, as a varactor) if all drain regions of the fins and all source regions of the fins are connected. In this case the broadened threshold voltage due to the different fin widths broadens the transition from a low capacitance to a high capacitance and so the tuning sensitivity, for example, in a voltage controlled oscillator (VCO) gets smaller and more linearized, which may reduce up conversion of flicker noise into VCO phase noise.

Figure 5A:
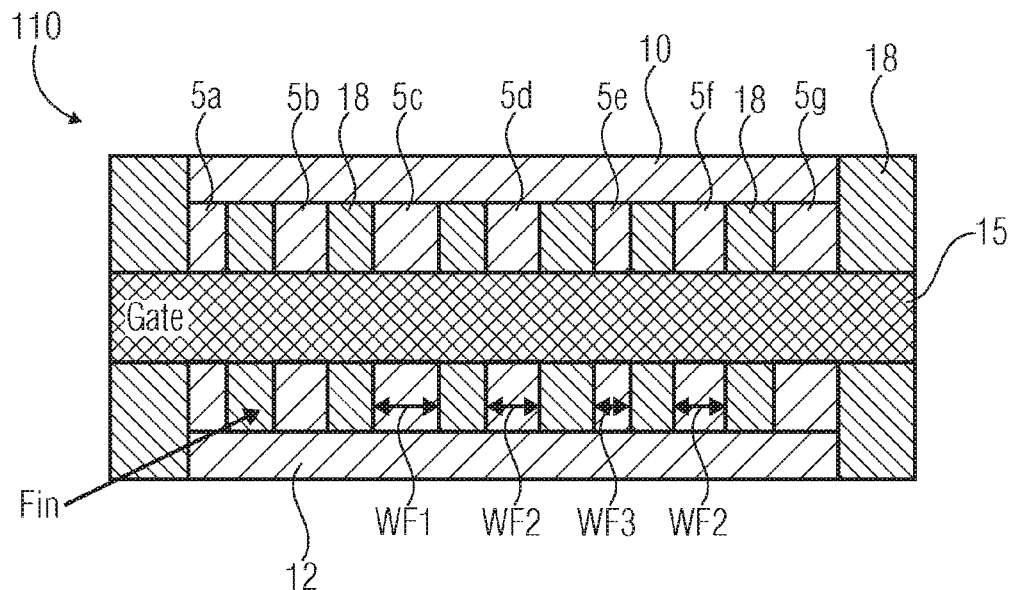
FIG. 5a shows a schematic top view of a FIN-FET comprising a plurality of fins with different fin widths coupled in parallel.
Figure 5B:
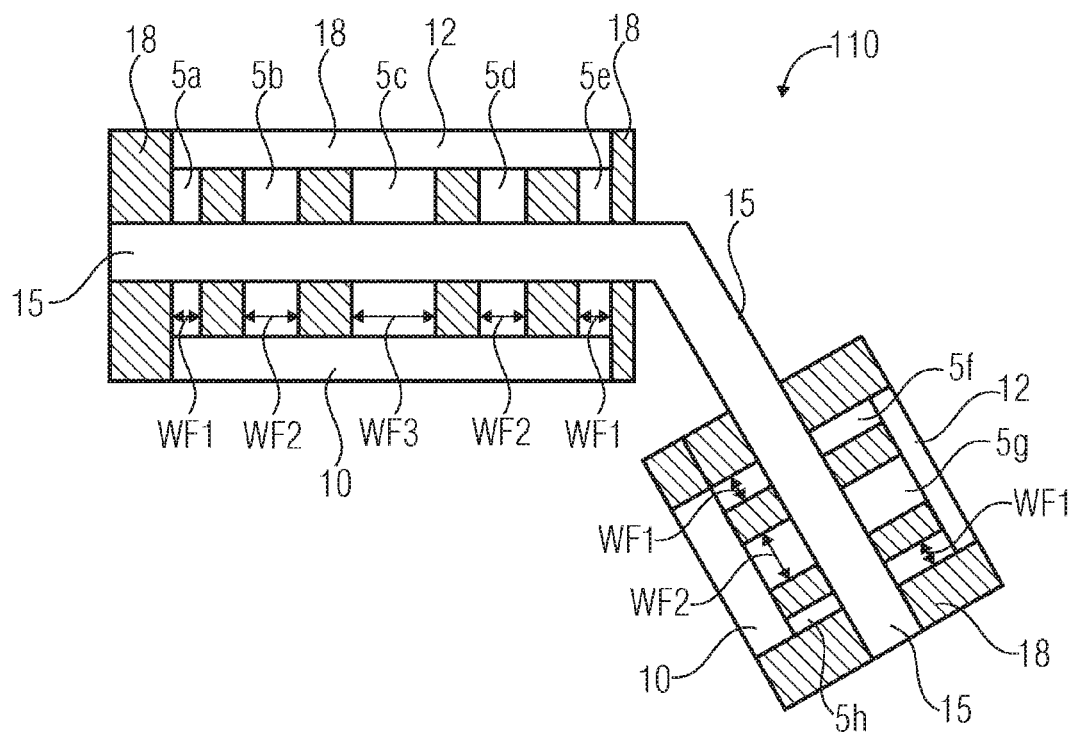
FIG. 5b shows a schematic top view of a FIN-FET comprising a plurality of fins with different fin width and a plurality of fins with a different crystal surface orientation compared to other fins of the FIN-FET according to an embodiment.

In FIG. 5a a schematic top view of a MUG-FET or FIN-FET device is depicted. In this embodiment a plurality of fins 5a-5g are coupled in parallel wherein the plurality of fins comprise a common gate 15, a common drain region 10 and a common source region 12. The plurality of fins may comprise different fin widths WF1, WF2 and WF3. As a result of the parallel connections of the plurality of fins 5a-5g the FIN-FET 110 may comprise multiple threshold voltages Vt because of the multiple fin widths of the fins. Each of the fins may form its own transistor with a transistor threshold voltage dependent among others on the respective fin width. The resulting multiple threshold voltages values Vt may cause a smoothing of the MUG-FET nonlinearities and an improved distortion behavior. The MUG-FET 110 may be, for example, a PMOS or NMOS transistor. The FIN-FET or the MUGFET may be part of an integrated circuit in a semiconductor substrate. In this embodiment fins with a different crystal surface orientation compared to other fins of the FIN-FET are not shown, but could be also included in the MUG-FET or FIN-FET structure.

According to another embodiment (FIG. 5b) a FIN-FET or a MUG-FET 110 can be part of an integrated circuit. The FIN-FET 110 may comprise a plurality of fins 5a-5h wherein a group of fins 5a-5e comprise a first fin orientation and a second group of fins 5f-5h comprise a second fin orientation. Fins 5f-5h may comprise a different crystal surface orientation compared to the plurality of fins 5a-5e. The FIN-FET 110 may comprise fins with different fin width, for example, fin 5a may comprise a fin width WF1 and fin 5b a fin width WF2. The fins may be separated by an insulating material 18, which is arranged between the fins. Furthermore, fins 5a-5e may comprise a common source region 12 coupled to a respective source electrode and a common drain region 10 coupled to a respective drain electrode. The same may be the case for fins 5f-5h. Fins 5a-5h may comprise a common gate 15. The gate electrode 15 may be spaced to the respective fins by a dielectric layer (not shown in FIG. 5b) between the fins and the gate electrode 15.

According to another embodiment of the invention the drain region 10 of fins 5a-5e and the drain region of fins 5f-5h may be coupled together as well as respective source regions of fins 5a-5h. Depending on a doping of the source-, drain- and channel regions such a structure may be a FIN-FET transistor 110, for example, a p-channel MOSFET (PMOS-FIN-FET) or an n-channel MOSFET (NMOS-FIN-FET).

According to another embodiment of the invention fins 5a-5e may share a common source region 12, a common drain region 10 and the gate 15. The fins may be doped such as to form an n-channel FIN-FET. Fins 5f-5h may form together with the respective source region 12, the drain region 10 and the gate electrode 15 a p-channel FIN-FET.

According to another embodiment of the invention the drain region 10 of fins 5a-5e and the drain region 10 of fins 5f-5h may be coupled together as well as the gate electrode so that an inverter structure of an integrated circuit (IC) is formed by the NMOS FIN-FET transistor comprising fins 5a-5e and by the PMOS FIN-FET transistor comprising fins 5f-5h. Because of the different crystal surface orientation of the NMOS and the PMOS transistor the mobility of the respective n- or p-type charge carrier in a channel region may be different.

A FIN-FET transistor 110 with different fin widths and different fin orientation can be connected in series and/or in parallel to form semiconductor devices with an improved linearity of the current voltage behavior, with an improved analog current gain gm/gds, an improved signal-to-noise ratio and with a reduced flicker noise.

Figure 5C:
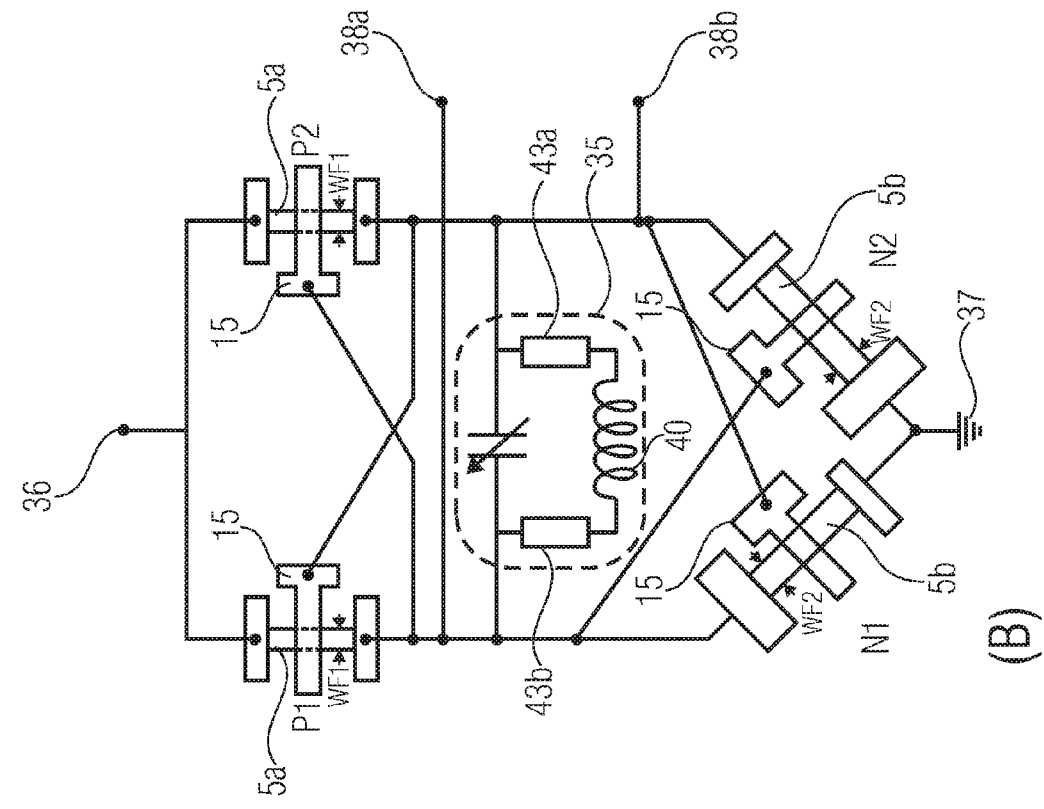
FIG. 5c shows a schematic top view of a voltage controlled oscillator (VCO) comprising two PMOS-FIN-FET with a certain crystal surface orientation of the fins and a certain fin width, coupled with two NMOS-FIN-FET with a different crystal surface orientation and a different fin width with respect to the two PMOS-FIN-FET according to an embodiment and a corresponding schematic of a VCO circuit.
Figure 5C:
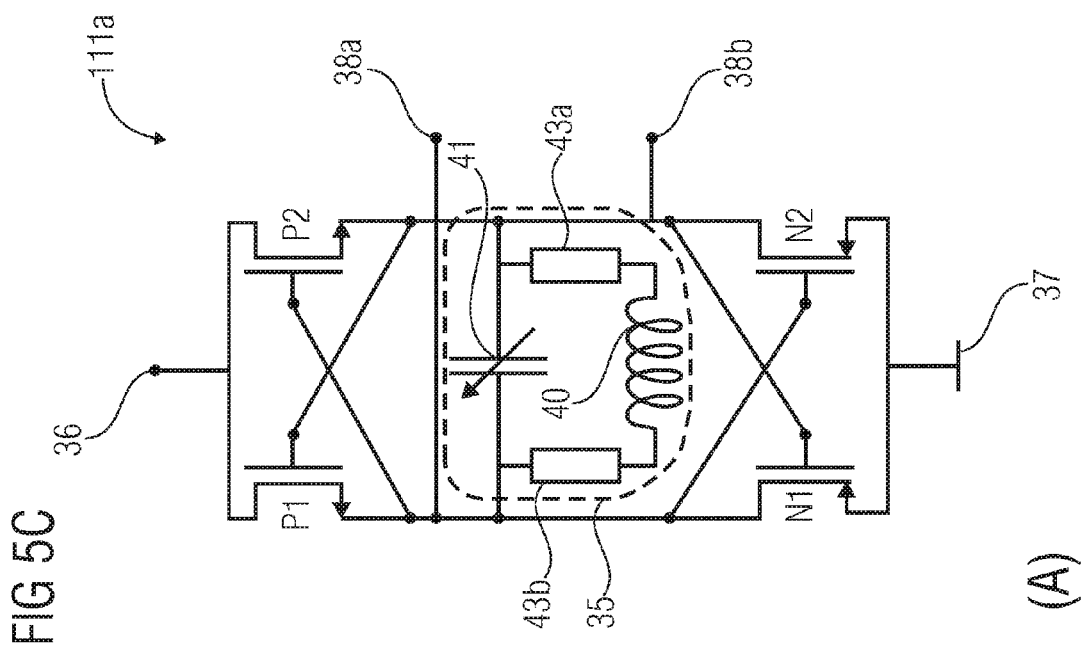

According to another embodiment for an integrated circuit in FIG. 5c(A), a voltage controlled oscillator (VCO) is shown. In a voltage controlled oscillator an output signal is generated with a frequency that varies dependent on an input voltage. A VCO is used in many applications, for example, in PLL (phase locked loops), DLLs (delay locked loops), for clock distribution, data modulation and data recovery. The VCO is realized (see FIG. 5c(B)) using two PMOS-FIN-FETs and two NMOS-FIN-FETs. The VCO circuit 111a comprises a first supply potential 36, for example, VDD and a second supply potential 37, for example, VSS or ground. The VCO further comprises two PMOS transistors P1 and P2 coupled in parallel with their source regions to the first supply potential 36. The gate of P1 is coupled to the drain region of P2 and the gate of P2 is coupled to the drain region of P1. The PMOS transistors P1 and P2 may be cross-coupled. The same is true for the cross-coupled NMOS transistors N1 and N2, which are coupled in parallel with their source regions to the second supply potential 37. The VCO includes a resonator 35, wherein the resonator comprises, for example, an inductive element 40, for example, a coil, resistive elements 43a and 43b, and a voltage dependent capacitance 41. The resonator is an LC-oscillating circuit. The voltage dependent capacitance is, for example, a varactor. The capacitance of which can be adjusted variably within a particular range by a voltage applied to the VCO. Changing the voltage between the first supply potential 36 and the second supply potential 37 may cause a change of the resonance frequency of the resonator 35 because of a change in capacitance. Thus, a variable, voltage dependent frequency can be generated. The respective output voltage signals from the oscillator can be taken at the outputs 38a and 38b. The cross coupled transistors P1 and P2 and N1 and N2 ensure the necessary ring gain through their feedback by forming a negative conductance stage that compensates for the losses in the LC tank.

In FIG. 5c(B) the realization of such a VCO by means of two pairs of cross-coupled FIN-FETs is shown. The transistors P1, P2, N1 and N2 in FIG. 5c(A) correspond to the respective PMOS-FIN-FETs P1, P2 and to the NMOS-FIN-FETs N1 and N2 in FIG. 5c(B). The FIN-FETs P1, P2, N1 and N2 can be arranged on a semiconductor substrate (not shown). They can be part of an integrated circuit. The PMOS-FIN-FETs P1 and P2 comprise a fin 5a with a fin width WF1, which is different to the fin width WF2 of the fins 5b of the NMOS-FIN-FET N1 and N2. Moreover, the fins 5b comprise a different crystal surface orientation compared to the fins 5a of the PMOS-FIN-FET. The coupling of the gate electrodes 15 and the source-drain regions of the FIN-FETs is done as described above, i.e., the PMOS-FIN-FETs P1 and P2 are coupled in parallel to the first supply potential 36 and the NMOS-FIN-FETs N1 and N2 are coupled in parallel to the second supply potential 37. The fins 5a of the PMOS-FIN-FET may be coupled in series to the fins 5b of the NMOS-FIN-FET and the resonator 35 may be coupled between the serial connection of P1 and N1, and P2 and N2.

The use of FIN-FETs as described herein may result, for example, in a reduced power consumption, higher output power or reduced phase noise of the VCO, because of the improved performance with respect to the linearity, the transconductance gm, and the signal-to-noise ratio of FIN-FETs. This improvement may be achieved by tailoring the fin width, the gate dimension, the distance between fins and the fin orientation.

Figure 5D:
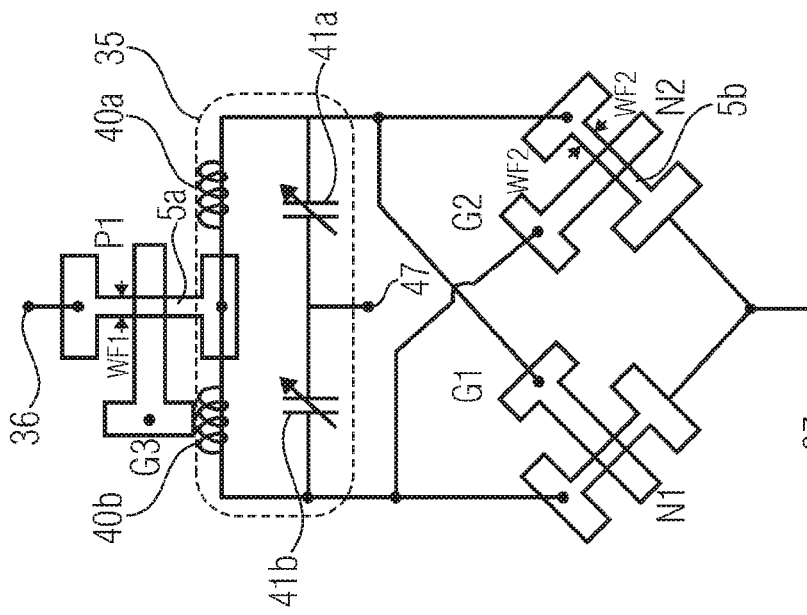
FIG. 5d shows a schematic top view of a voltage controlled oscillator (VCO), comprising a current source formed by a PMOS-FIN-FET, having a certain surface orientation and fin width coupled to two NMOS-FIN-FET, having a different crystal surface orientation and fin width with respect to the PMOS-FIN-FET according to an embodiment and a corresponding schematic of a VCO circuit.
Figure 5D:
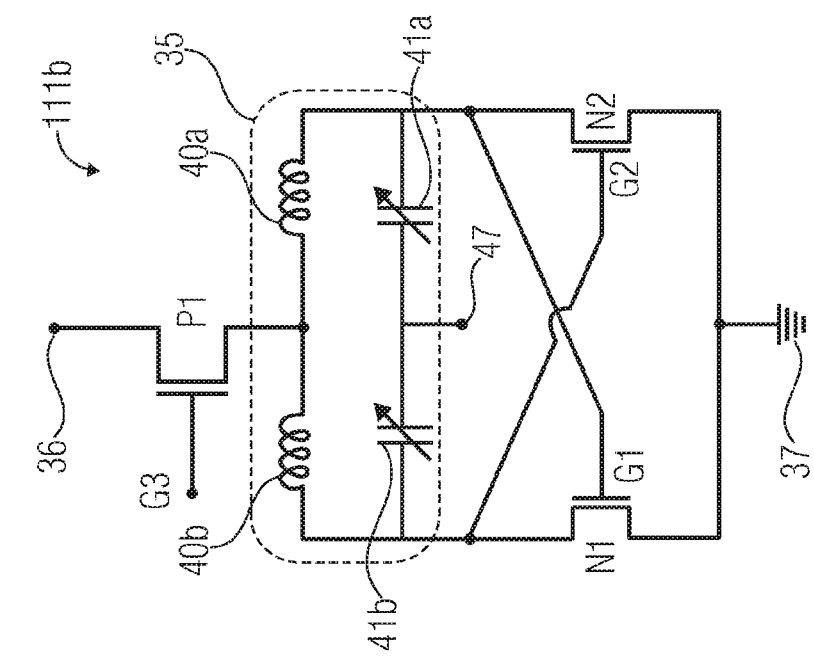

According to a further embodiment of an integrated circuit, in FIG. 5d(A), another VCO circuit 111b is shown. The VCO comprises a PMOS-transistor P1 with a gate electrode G3, a resonator 35, and a pair of cross-coupled NMOS-transistors N1 and N2. The resonator may comprise two voltage dependent capacitive elements 41a and 41b and two inductive elements 40a and 40b, coupled in parallel with P1 and with the output 47 for the frequency tunable voltage. The frequency of the tunable voltage 47 may be changed by changing the capacitance of 41a und 41b, and hence the resonance frequency of the resonator 35. The current source P1 may be used to provide bias current for the cross-coupled NMOS-transistors N1 and N2.

In FIG. 5d(B), the realization of the VCO, which is depicted in FIG. 5d(A), by means of FIN-FETs is shown. The PMOS-FIN-FET P1 may comprise a fin 5a with a fin width WF1, and a first crystal surface orientation. The NMOS-FIN-FET N1 and N2 may comprise a fin 5b, with a fin width WF2 different to WF1 and with a surface orientation of the fin 5b, which is also different to the crystal surface orientation of the fin 5a of P1. In this embodiment the NMOS-FIN-FETs N1 and N2 are coupled in parallel with the second supply potential 37.

Figure 5E:
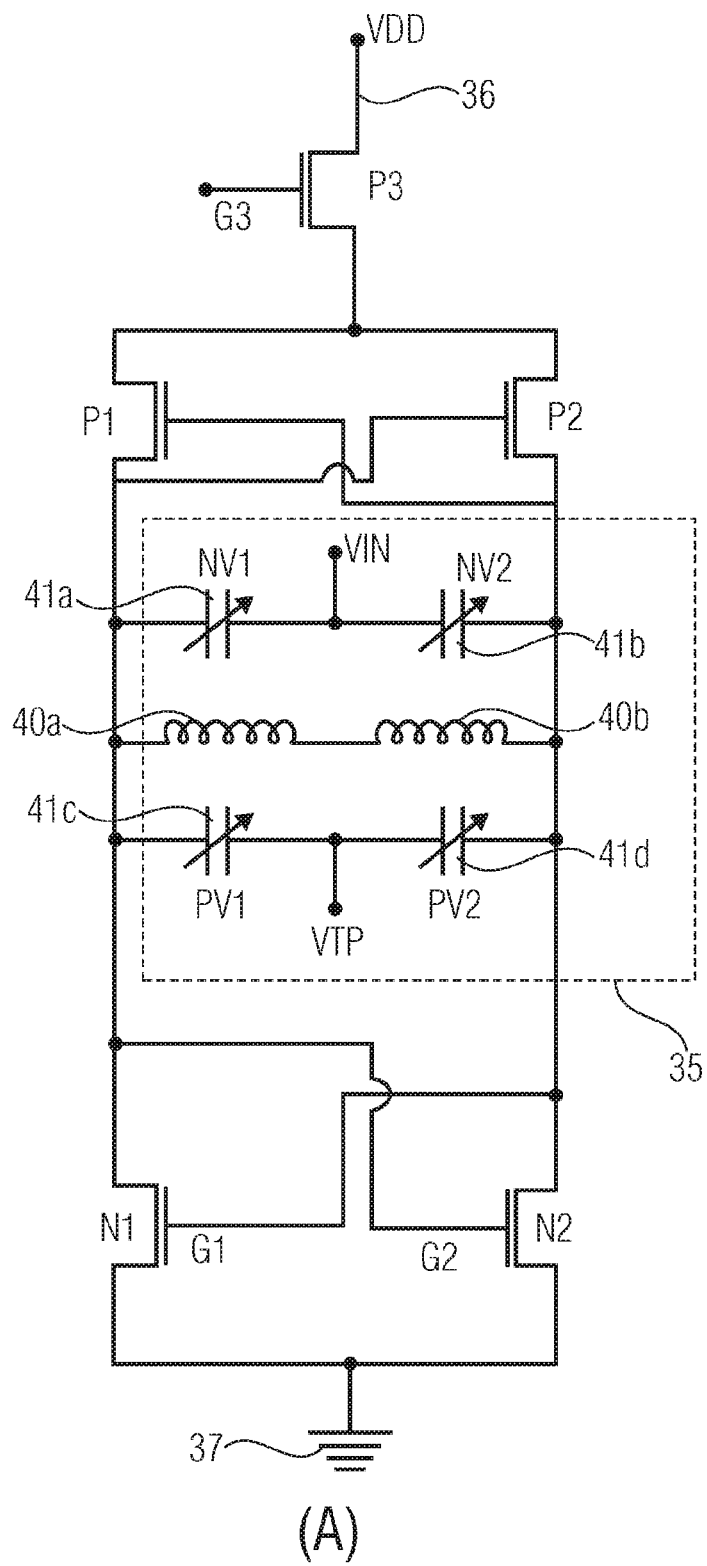
FIG. 5e shows a schematic top view of another voltage controlled oscillator (VCO), comprising NMOS- and PMOS-FIN-FETS, as well as NMOS- and PMOS-varactors according to an embodiment.
Figure 5E:
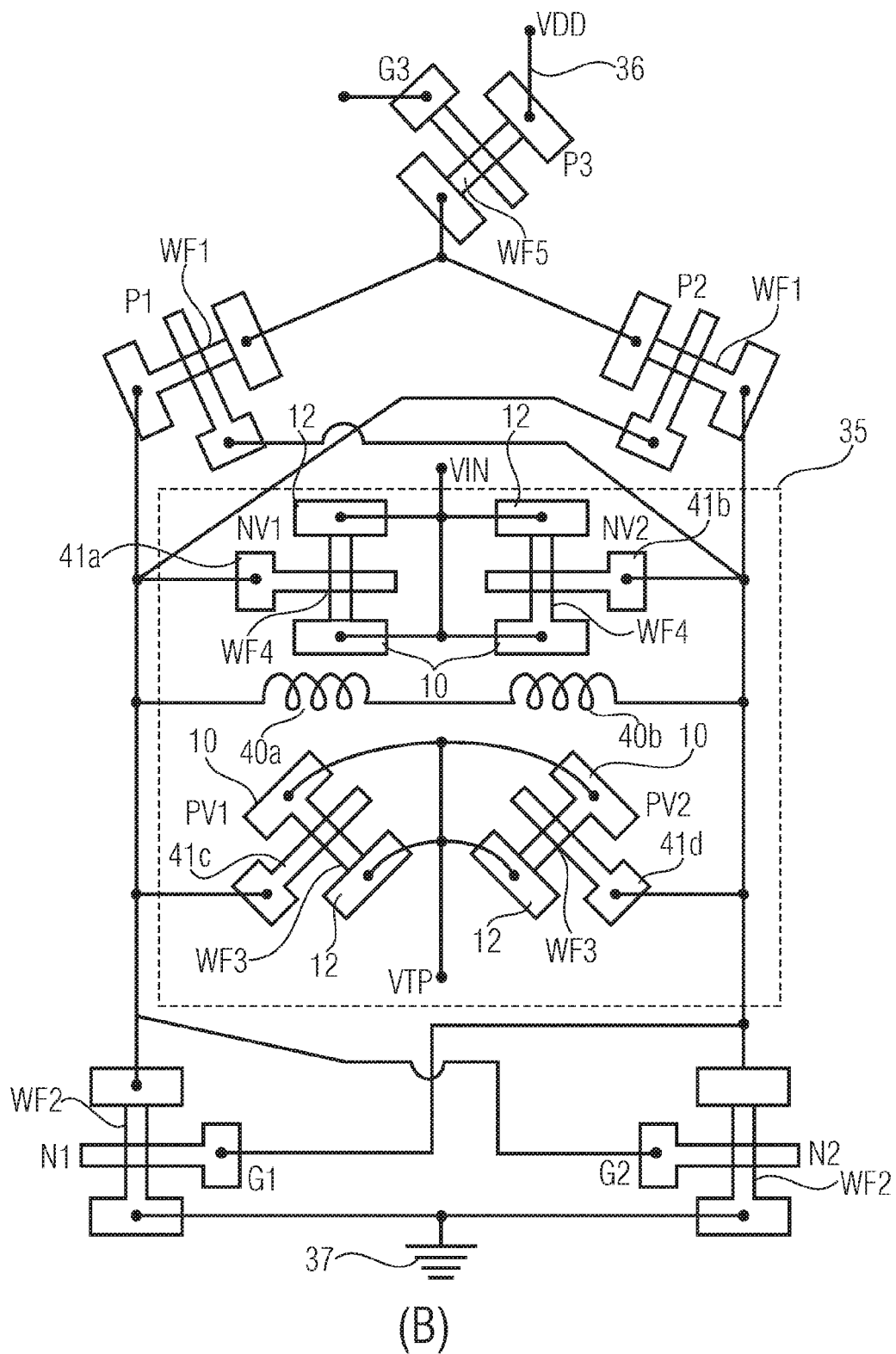

FIG. 5e shows another embodiment of a VCO by means of fin devices. In FIG. 5e(A) the schematic of such a VCO is depicted. The VCO comprises a PMOS-transistor P3 with a gate electrode G3, a resonator 35, a pair of cross-coupled NMOS-transistors N1 and N2 and a pair of cross-coupled PMOS-transistors P1 and P2. In this embodiment the resonator 35 may comprise four voltage dependent capacitive elements 41a, 41b, 41c and 41d and two inductive elements 40a and 40b. A frequency tuning voltage VTN of the VCO is provided between the voltage dependent capacitive elements 41a and 41b and another frequency tuning voltage VTP of the VCO is provided between the voltage dependent capacitive elements 41c and 41d. The voltage dependent capacitive elements 41a and 41b, the inductive elements 40a and 40b and the voltage dependent capacitive elements 41c and 41d are connected to the cross-coupled NMOS- and PMOS transistor pairs. The NMOS-transistor pair N1 and N2 is connected to the second supply potential 37 (ground) as described in context to FIG. 5c. The cross-coupled PMOS-transistor pair P1 and P2 is connected via the PMOS-transistor P3 to the first supply potential VDD. The PMOS-transistor P3 may be used to provide bias current for the VCO.

In FIG. 5e(B) the realization of such a VCO by means of fin devices (FIN-FET and varactors) is shown. Corresponding devices or elements are described again with the same reference numerals. The transistor P3 can be realized by a PMOS-FIN-FET comprising a fin width WF5 and a fin orientation different to the fin orientation of the cross-coupled PMOS-FIN-FETs P1 and P2. PMOS-FIN-FETs P1 and P2 comprise a fin width WF1, which may be larger than a fin width WF2 of the cross-coupled NMOS-Fin-FETs N1 and N2. NMOS-Fin-FETs N1 and N2 comprise a different fin orientation compared to the PMOS-FIN-FETs P1 and P2. The voltage dependent capacitive elements 41a and 41b can be realized as varactors. Such a varactor may be a Fin-FET structure, wherein source regions 12 and drain regions 10 are connected, as it is shown in FIG. 5e(B). The voltage dependent capacitive elements 41a and 41b are realized as NMOS-varctors NV1 and NV2 with a fin width of WF4. The voltage dependent capacitive elements 41c and 41d can be realized as PMOS-varactors PV1 and PV2 with a fin width WF3. The orientation of the respective fins of the PMOS-varactors PV1 and PV2 and the NMOS-varctors NV1 and NV2 can be different. In some embodiments WF5 and WF2 may correspond to a minimal fin width, which can be fabricated. The fin width WF1 can be larger than the fin widths WF2 and the fin widths WF3 and WF4 can be larger than WF1.

Figure 5F:
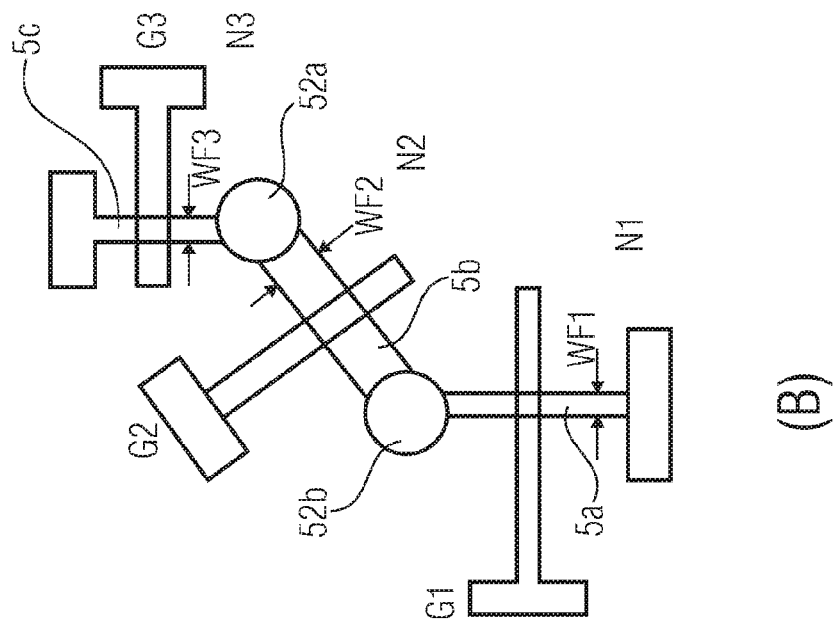
FIG. 5f shows a schematic top view of a mixer circuit comprising NMOS-FIN-FETs, which are coupled in series and which comprise fins with different fin widths and fins with a different crystal surface orientation according to an embodiment and a corresponding schematic of a mixer circuit.
Figure 5F:
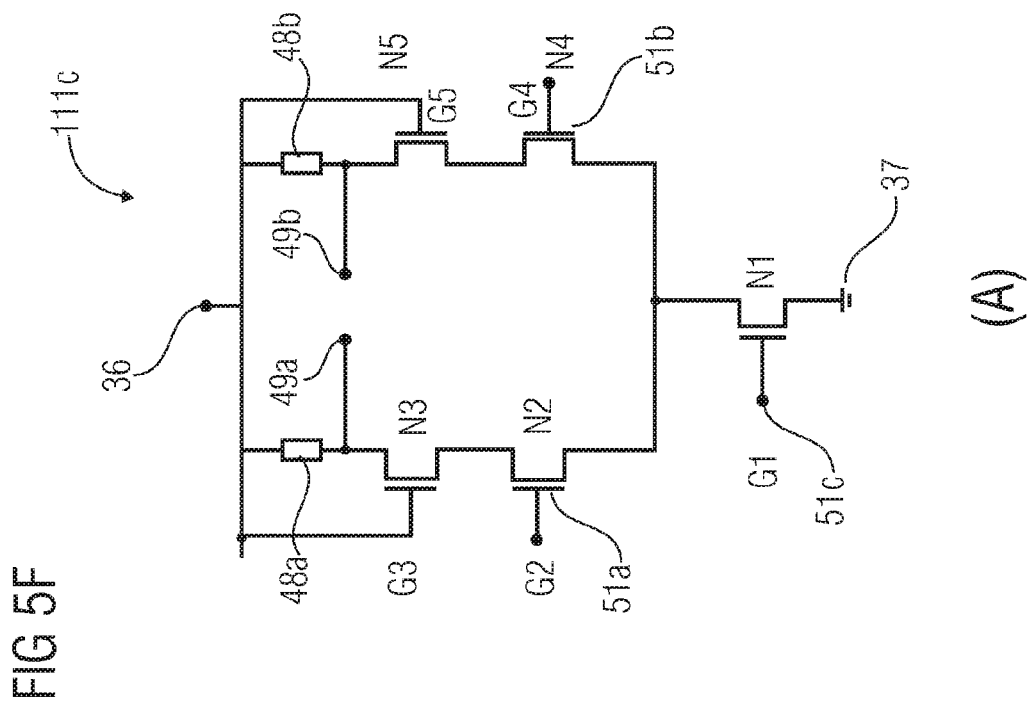

In FIGS. 5f(A) and (B), a schematic of a mixer 111c is shown. In this embodiment the mixer 111c comprises two NMOS-FIN-FETs having a certain surface orientation and fin width. The two NMOS-FIN-FETs are coupled in series to a third NMOS-FIN-FET, having a different surface orientation and a different fin width. A mixer, such as, for example a single balanced mixer or a double balanced mixer, also named Gilbert cell, can be configured to mix a signal to be mixed with a local oscillator signal and as a consequence a frequency conversion can be performed for the signal to be mixed.

The mixer circuit 111c, shown in FIG. 5f(A), comprises an NMOS-transistor N1, with a gate G1 coupled to the voltage signal 51c to be mixed and with a source-drain region coupled between the second supply potential 37 and the remaining circuit parts described below. The input transistor N1 may be configured to convert a voltage signal applied to the gate G1 in a current signal, which is provided to the mixer. The second supply potential 37 may be, for example, the ground potential. Moreover the mixer circuit may comprise two NMOS-transistors N2 and N3 on one branch of the parallel circuit, which are coupled in series between a first supply potential 36 and N1. The other branch of the parallel circuit may also comprise two NMOS-transistors N4 and N5, which are coupled in series between a first supply potential 36 and N1. The first supply potential 36 can be the operation voltage VDD for operating the mixer circuit. The wires, the conductive connections and other electric elements or semiconductor devices that couple or connect the Fin-FET may form a circuitry and may be named circuitry herein.

In addition, each branch of the parallel circuit may comprise a load 48a, b, coupled between N3 and N5 and the first supply potential 36. The load 48a, b can be resistors or inductors or combination of resistors, inductors and capacitors, which are effective as mixer loads.

The gate G2 of the NMOS transistor N2 may be coupled to a first local oscillator input (not shown in FIG. 5e). The first local oscillator input may have a first local oscillator signal 51a applied to it. Thus, N2 can be controlled by means of the local oscillator signal, i.e., N2 can be turned on or off. The drain connection of N3 may be coupled to a first output 49a for the converted signal.

Connected to the gate G4 of N4 is a signal 51b from the local oscillator, which is inverted or 180° out of phase to the signal 51a. The drain connection of N5 can be coupled to a second output 49b for the converted signal.

In FIG. 5f(B), the realization of the transistors N1, N2 and N3 of the mixer 111c by means of corresponding FIN-FETs is schematically shown. Transistors N1, N2 and N3 are NMOS-FIN-FETs coupled in series. Transistor N1 comprises a fin 5a with a fin width WF1. Transistor N2 comprises a fin 5b with a fin width WF2, which is different to WF1 and with a crystal surface orientation of the fin 5b, which is also different to the crystal surface orientation of fin 5a.

Transistor N3 has a fin 5c, with a fin width WF3, which is different to WF1 and WF2. The surface orientation of fin 5c is different to the surface orientation of fin 5b. The fins 5b and 5c, which comprise the channel regions of the NMOS transistors N3 and N2 may be coupled to each other via a conductive connection 52a. The fins 5a and 5b of the transistors N2 and N1 may be coupled via the conductive element 52b. The use of FIN-FETs in such a mixer circuit may improve the signal/noise ratio of the mixer. The mixer 111c and its realization with connected FIN-FETs can be considered as an integrated circuit or as a part of an integrated circuit.

It should be noted that in alternative embodiments the conductivity type of the used semiconductor elements can be changed and the fins of the FIN-FETs may comprise, for example, different gate dimensions, or a different distance or pitch between neighboring fins.

The integrated circuit (IC), the semiconductor element, the FIN-FET or MUG-FET may be fabricated in a complementary oxide-semiconductor-technology (CMOS) or another semiconductor technology, which is used for producing a semiconductor device, a semiconductor element or an integrated circuit. Such a semiconductor technology may include the silicon-on-insulator (SOI) technique with buried oxide layers (BOX) or the technology to form a bulk-Fin-FET in a bulk-silicon substrate. Such a bulk-FIN-FET may comprise, in addition to the source-, drain- and gate-contacts, a body-zone with a bulk contact between the bulk-silicon-substrate and the bottom of the fin thereon. FIN-FETs fabricated in SOI technology do not comprise such a bulk contact.

According to embodiments, the spacing between different fins of the plurality of fins may be different or equal. In some embodiments, a reduction in the flicker noise is achieved when a fin comprises a larger thickness or fin width. This may be a result of having the presence of different flicker noises corresponding to different surface features. A different flicker noise may be a result of the interface between the fin and dielectric material forming the gate. The impact of this interface on the flicker noise depends on surface features of the fin like e.g. surface orientation and surface roughness. The crystal surface orientation may be defined by the Miller indices, e.g. <100>. In some embodiments crystal surfaces may have surface direction <100>, <010>, <001>, <110> or <101>.

According to some other embodiments the thickness of a fin or the fin width of at least a first fin of the plurality of fins can be chosen according to desired device characteristic. A fin width may be smaller than 40 nm, smaller than 30 nm, smaller than 20 nm, smaller than 16 nm, smaller than 12 nm or smaller than 10 nm. In some embodiments the following relations between the gate length GL, the fin width WF and the fin height H may be applied to a fin device, e.g., a FIN-FET or varactor: $GL/2 \leq WF \leq 15 \cdot GL$ or $H/2 \leq WF \leq 15 \cdot GL$. Parts of the fin may form a body zone of a transistor and other regions of the fin may form a channel region, a source region and a drain region. The body-zone of a bulk-FIN-FET may be electrically connected to a fin of the bulk-Fin-FET. In an SOI-FIN-FET the body-zone is not electrically connected to a fin of the SOI-FIN-FET.

In an embodiment an integrated circuit may comprise a first FIN-FET and a second FIN-FET as described herein. According to this embodiment the first FIN-FET is an SOI-FIN-FET or a bulk-FIN-FET and the second FIN-FET is an SOI-FIN-FET or a bulk-FIN-FET. In a further embodiment at least one fin of the plurality of fins of the first FIN-FET comprises a body-contact connecting a part of the fin under the channel region to the substrate.

According to another embodiment of the invention, the semiconductor element or the multiple gate field-effect transistor may comprise at least a first fin with a <100> top surface and a second fin, which may comprise, by rotating the second fin by a 45° angle to the <010> surface, a <011> surface for the side wall. Such different surface orientation may be chosen to enhance mobility of respective charge carriers or to reduce flicker noise, which is dependent on the surface orientation and a surface roughness of the fin. A smooth fin surface has a lower flicker noise than a rough surface. That means the device performance of a semiconductor device, for example a FIN-FET, may be tailored by choosing different contribution of top and side wall surfaces. For a transistor, for example, the signal can be increased by reducing the source drain resistance. Consequently, the signal-to-noise ratio is increased due to the increase in signal and reduction in the flicker noise.

According to a further embodiment at least a fin of the plurality of fins may comprise a shape that is different to a square shape.

A fin of the plurality of fins may comprise, for example, a modulated thickness form and/or a modulation in the fin height or fin length.

According to some embodiments, by tailoring the fin width of a fin one can combine a reduced flicker noise together with, for example, a lower drain or source resistance, which may be desirable for devices used in radio frequency (RF) circuits.

According to another embodiment of the invention, the thickness of a fin (=fin width) may be larger than 40 nm, which may lead to an increased gate resistance, but may be tolerated due to the low-frequency operation of the device.

According to another embodiment of the invention, the thickness of a fin (=fin width) may be larger than 40 nm but smaller than 1 um, in cases where a lower gate resistance is required.

Figure 6:
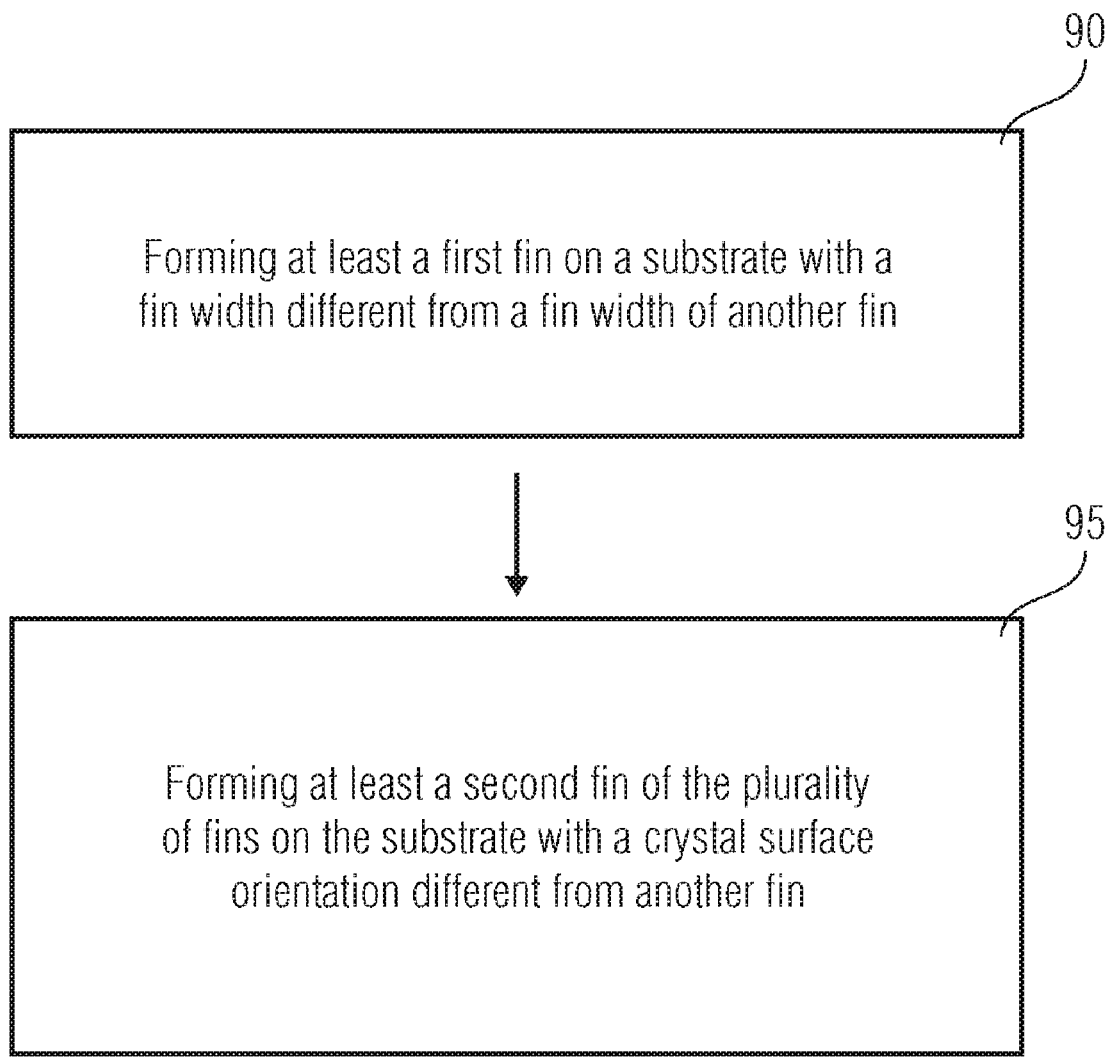
FIG. 6 shows a flow chart for the method of producing a semiconductor element according to an embodiment.

FIG. 6 shows a flow chart for the method of producing a semiconductor element. The method comprises forming 90 at least a first fin of a plurality of fins on a substrate, e.g., on a semiconductor substrate, with a fin width different from a fin width of another fin of the plurality of fins. The method further comprises forming 95 at least a second fin of the plurality of fins on the substrate with a crystal surface orientation different from another fin of the plurality of fins. Forming 95 of at least a second fin with a crystal surface orientation different from another fin of the plurality of fins may be performed first and afterwards the forming 90 of at least the first fin on a substrate with a fin width different from a fin width of another fin of the plurality of fins may be employed. The forming 90 of at least the first fin may be performed so that a first fin comprises, along the length of the fin, a different fin width. That means the fin may comprise different segments with a different fin width. The first fin may be formed so that the fin width is continually varying along the length of the fin or at least along segments of the fin. According to some other embodiments the producing of a semiconductor element may furthermore comprise a doping of the fin or at least of parts of the fin so that a fin may comprise regions with a different conductivity. This means that a fin region may comprise an n- and/or p-type conductivity and other regions of the fin may comprise the opposite conductivity. Hence the respective fin regions may be doped with the respective n- or p-type dopants.

In some embodiments it is shown that it is possible to compensate a reduced analog and RF performing, e.g., linearity voltage gain gm/gds, signal-to-noise ratio by tailoring the fin width of a plurality of fins and by arranging on the substrate at least a second fin of the plurality of fins rotated or with a different crystal surface orientation compared to another fin of the plurality of fins. A semiconductor element or a semiconductor device, which comprises the semiconductor element, e.g., a FIN-FET, a MUG-FET, an integrated circuit or a p-/n-MOSFET, may comprise at least two fins wherein a first fin comprises a different fin width compared to a second fin. Devices with different fin width allow for improved linearity, improved transconductance and reduced flicker noise. A second fin of the at least two fins may comprise a different crystal surface orientation compared to the first fin. A change of fin orientation may allow for changed surface orientation and so for changed charge carrier mobility and changed flicker noise, together resulting in an improved linearity and signal-to-noise ratio of the respective conductor element or device. In an embodiment an integrated circuit may comprise a semiconductor element with different fin widths and fin orientation and hence an improved linearity, gain and signal-to-noise ratio. At least one of the top and side walls of a fin, e.g., the second fin, may have different surface orientation for at least one fin orientation. Fins with different fin width and different fin orientation (rotated/not rotated) can be connected in series or in parallel to form devices for improved linearity, analog voltage gain gm/gds and improved signal-to-noise ratio.

According to an embodiment, two fins may comprise two segments having different fin widths. The first fin may have a <100> surface crystal orientation for top and side wall planes and the second fin may have a <100> for top and a <110> orientation for side wall planes of fin. In another embodiment, two fins may comprise different crystal surface orientation by arranging one fin in a 45° rotated manner. The non-rotated fin may have a <100> crystal surface orientation in top and side wall planes of the fin and the rotated one may have a <100> orientation in the top surface and <110> in the side wall planes of the fin. Additionally, at least one of the fins may comprise a different fin width along its length or compared to the fin width of another fin of the plurality of fins. In other embodiments a fin may comprise two fin segments having different fin widths.

In some embodiments the use of fins with different fin widths may lead to a fin width dependent threshold voltage for a semiconductor device, for example, for a FIN-FET. This may cause an improvement of the electrical characteristic of the FIN-FET. The combination of different fin widths and different surface orientation may be done, for example, in two ways—in a serial and/or parallel manner—, to optimize different transistor parameters.

According to some embodiments it is possible to use different fin widths in a parallel configuration to generate a transistor with modulated threshold voltages. This may result in a reduced harmonic distortion, since nonlinearities of the transistor transfer curves are smoothed by a piecewise linearization technique. According to embodiments of the invention, the semiconductor element may further comprise at least a second fin with a fin orientation different to the fin orientation of the plurality of fins. As a consequence of such a rotated fin structure a charge carrier flow in the fin may comprise a changed mobility compared to a charge carrier flow in the not rotated fins. This may also lead to a reduced flicker noise and together resulting in an improved linearity and signal/noise ratio.

According to some embodiments, it is also possible to use fins with different fin widths along the length of the fin to improve an electric characteristic, like series resistance, output conductance (gds), drain capacitance or flicker noise. It is also possible to change the fin width step-like (see FIG. 2a) along the fin length. The two different fin width WF1 and WF2 can be used to generate two channel regions with different threshold voltages, drain and source resistances and flicker noise because flicker noise of drain current depends on noise contributions along the channel length and possibly additionally also mobility and flicker noise if fins with different crystal orientation in top and sidewall surface are used. These features can be used to provide improved output conductance, transconductance and improved signal to noise ratio.

According to another embodiment a possible reliability problem resulting from the fin edges, can be solved by additionally segmenting the (poly-) gate of the fin. In some embodiments, different examples of fins with a different fin width are shown. Different examples for multiple fin widths along the channel length of a MUG-FET transistor are shown as well. According to an embodiment, a fin may comprise two fin widths in order to generate two channel regions with different threshold voltage for self-cascoding of the transistor. This may lead to an improved conductance gds and so voltage gain gm/gds. The segmentation of a gate structure, at least partly overlapping with the fin, may avoid fin edges in the active region of the transistor structure. According to another embodiment, a reduced series resistance may be achieved by using a fin with different fin segmentation wherein a fin segment with a wider fin width is arranged in the outer regions of the fin or only at the source side because the transconductance is influenced mainly by the source resistance. According to a further embodiment a FIN-FET may comprise a fin with two asymmetric channel regions, wherein the fin may comprise in the outer regions a wider fin width than in a region or inner segment of the fin.

What is claimed is:
1. A semiconductor element, comprising:
a plurality of fins, wherein at least a first fin of the plurality of fins comprises a different fin width compared to a fin width of another fin of the plurality of fins, and wherein at least a second fin of the plurality of fins comprises a different crystal surface orientation compared to another fin of the plurality of fins.
2. The semiconductor element according to claim 1, wherein the plurality of fins are arranged at least on one substrate or on at least two substrates.
3. The semiconductor element according to claim 1, wherein the second fin comprises a different fin width compared to a fin width of another fin of the plurality of fins and a different crystal surface orientation compared to another fin of the plurality of fins.
4. The semiconductor element according to claim 1, wherein the first fin comprises at least a first segment, and wherein the fin width along the first segment is different compared to the fin width of another fin of the plurality of fins.
5. The semiconductor element according to claim 1, wherein the first fin comprises at least a first segment; and wherein the fin width along the first segment is different from a fin width of at least a second segment of the first fin.
6. The semiconductor element according to claim 5, wherein the fin width varies continuously along the length of the first segment.
7. The semiconductor element according to claim 1, wherein the first fin comprises a fin width gradually changing along the length of the fin.
8. The semiconductor element according to claim 1, wherein at least one of the top wall and side wall of the second fin comprises a different crystal surface orientation compared to another fin of the plurality of fins.

9. The semiconductor element according to claim 1, wherein the second fin has a <100> top wall crystal surface orientation and a <110> side wall crystal surface orientation and wherein another fin of the plurality of fins has a <100> top wall crystal surface orientation and a <100> side wall crystal surface orientation.

10. The semiconductor element according to claim 1, wherein the second fin has a <100> top wall crystal surface orientation and a <100> side wall crystal surface orientation and wherein another fin of the plurality of fins has a <100> top wall crystal surface orientation and a <110> side wall crystal surface orientation.

11. The semiconductor element according to claim 1, wherein at least the first and the second fin comprises a source region and a drain region separated by a channel region.

12. The semiconductor element according to claim 1, wherein the channel region is at least partly covered with a gate dielectric and the gate dielectric is at least partly covered with a gate electrode, so that a fin-field-effect-transistor (FIN-FET) is formed and a current flow through the channel region is controllable by the gate electrode.

13. Semiconductor element according to claim 12, wherein the fin width of the first fin is configured so that a transistor threshold voltage for the first fin is different from the transistor threshold voltage for another fin of the plurality of fins.

14. A device, comprising:
a plurality of fins arranged on a substrate, wherein at least a first fin of the plurality of fins comprises a different fin width compared to another fin of the plurality of fins, and wherein at least a second fin of the plurality of fins comprises a different crystal surface orientation compared to another fin of the plurality of fins;
source regions with a source electrode and drain regions with a drain electrode separated by channel regions formed in the first and the second fin of the plurality of fins, wherein the source regions and the drain regions comprise a different type of conductivity compared to the channel region;
a gate dielectric covering at least a part of the channel regions; and
a gate electrode covering at least a part of the gate dielectric configured to control a current flow in the channel regions by a voltage applied at the gate electrode.

15. The device according to claim 14, wherein the device is either a silicon-on-insulator fin-field-effect transistor (SOI-FIN-FET) or a bulk-FIN-FET.

16. The device according to claim 14, wherein at least one fin of the plurality of fins comprises a body-contact connecting a part of the fin under the channel region to the substrate.

17. The device according to claim 14, wherein the source region and the drain region are connected, so that a varactor is formed.

18. The device according to claim 14, wherein the second fin comprises a different fin width compared to a fin width of another fin of the plurality of fins and a different crystal surface orientation compared to another fin of the plurality of fins.

19. The device according to claim 14, wherein the plurality of fins form a N-metal-oxide-semiconductor FIN-FET (NMOS FIN-FET) or a P-metal-oxide-semiconductor FIN-FET (PMOS FIN-FET).

20. The device according to claim 14, wherein the fin width of the first fin is configured so that a transistor threshold voltage for the first fin is different from a transistor threshold voltage of another fin of the plurality of fins.

21. The device according to claim 14, wherein the plurality of fins are coupled in parallel or in series.

22. The FIN-FET according to claim 14, wherein the first fin comprises at least a first channel region segment, with a fin width along the first channel region segment, different from a fin width of a at least second channel region segment of the first fin, so that the first channel region segment and the second channel region segment are forming two channel region coupled in series.

23. The device according to claim 14, wherein at least one of the top wall and side wall of the second fin comprises a different crystal surface orientation compared to another fin of the plurality of fins.

24. An integrated circuit, comprising:
a first fin-field-effect-transistor (FIN-FET) and a second FIN-FET, wherein the FIN-FETs comprise a plurality of fins, wherein at least a first fin of the plurality of fins comprises a different fin width compared to another fin of the plurality of fins and wherein at least a second fin of the plurality of fins comprises a different crystal surface orientation compared to another fin of the plurality of fins;
source regions with a source electrode and drain regions with a drain electrode separated by channel regions formed in at least one fin of the first FIN-FET and in at least one fin of the plurality of fins;
a gate dielectric covering at least a part of the channel; and
at least a gate electrode covering at least a part of the gate dielectric.

25. The integrated circuit according to claim 24, wherein the plurality of fins are arranged at least on one substrate and wherein the first FIN-FET and the second FIN-FET are connected in series or in parallel.

26. The integrated circuit according to claim 24, wherein said first FIN-FET is a SOI-FIN-FET or a bulk-FIN-FET, and wherein said second FIN-FET is a SOI-FIN-FET or a bulk-FIN-FET.

27. The integrated circuit according to claim 24, wherein at least one fin of the plurality of fins of the first FIN-FET comprises a body-contact connecting a part of the fin under the channel region to the substrate.

* * * * *